US012787880B2

(12) United States Patent
Medikonda et al.

(10) Patent No.: US 12,787,880 B2
(45) Date of Patent: Nov. 3, 2026

(54) DUAL-SIDE BRIDGE CHIPS CONNECTING TWO SEMICONDUCTOR CHIPS WITH STACKED SEMICONDUCTOR DEVICES

(71) Applicant: International Business Machines Corporation, Armonk, NY (US)

(72) Inventors: Manasa Medikonda, Albany, NY (US); Tao Li, Slingerlands, NY (US); Ruilong Xie, Niskayuna, NY (US); Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 18/476,545

(22) Filed: Sep. 28, 2023

(65) Prior Publication Data

US 2025/0112203 A1 Apr. 3, 2025

(51) Int. Cl.
*H01L 25/065* (2023.01)
*H01L 23/00* (2006.01)
(Continued)

(52) U.S. Cl.
CPC ............ *H10W 90/00* (2026.01); *H10B 80/00* (2023.02); *H10W 20/20* (2026.01); *H10W 70/611* (2026.01); *H10W 70/635* (2026.01); *H10W 70/65* (2026.01); *H10W 72/20* (2026.01); *H10W 90/401* (2026.01); *H10W 90/701* (2026.01); *H10W 90/724* (2026.01); *H10W 74/15* (2026.01); *H10W 90/297* (2026.01); *H10W 90/722* (2026.01); *H10W 90/732* (2026.01); *H10W 90/792* (2026.01)

(58) Field of Classification Search
CPC ............... H10W 90/00; H10W 90/724; H10W 70/611; H10W 70/616; H10W 70/65
See application file for complete search history.

(56) References Cited

U.S. PATENT DOCUMENTS

| | | | | |
|---|---|---|---|---|
| 11,507,527 B2 | 11/2022 | Saleh | | |
| 12,362,278 B2 | 7/2025 | Li et al. | | |
| 2015/0294963 A1 | 10/2015 | Lin | | |
| 2016/0093590 A1* | 3/2016 | Chen | ..................... | H10W 90/00 257/737 |

(Continued)

OTHER PUBLICATIONS

R. Mahajan et al., "Embedded Multi-die Interconnect Bridge (EMIB)—A High Density, High Bandwidth Packaging Interconnect", IEEE 66th Electronic Components and Technology Conference (ECTC), Las Vegas, NV, USA, 2016, pp. 557-565, doi: 10.1109/ECTC.2016.201.

(Continued)

*Primary Examiner* — Victoria K. Hall
(74) *Attorney, Agent, or Firm* — Edward J. Wixted, III

(57) ABSTRACT

A semiconductor structure includes at least two chiplets, where each chiplet includes a top semiconductor device with frontside interconnect wiring contacting a substrate with through-silicon vias and the top semiconductor device contacts a bottom semiconductor device with backside interconnect wiring. At least a first bridge chip connects to a first portion of the backside interconnect wiring in each of the two chiplets and at least a second bridge chip connects the frontside interconnect wiring in each of the two chiplets to the substrate with the through-silicon vias in each of the two chiplets. The top semiconductor device and the bottom semiconductor device in each of the two chiplets are electrically connected.

19 Claims, 13 Drawing Sheets

(51) Int. Cl.

| | |
|---|---|
| ***H01L 23/48*** | (2006.01) |
| ***H01L 23/538*** | (2006.01) |
| ***H01L 25/00*** | (2006.01) |
| ***H10B 80/00*** | (2026.01) |
| ***H10W 20/20*** | (2026.01) |
| ***H10W 70/60*** | (2026.01) |
| ***H10W 70/63*** | (2026.01) |
| ***H10W 70/65*** | (2026.01) |
| ***H10W 72/20*** | (2026.01) |
| ***H10W 90/00*** | (2026.01) |
| *H10W 74/15* | (2026.01) |
| *H10W 90/20* | (2026.01) |

(56) References Cited

U.S. PATENT DOCUMENTS

| | | | | |
|---|---|---|---|---|
| 2020/0006251 | A1* | 1/2020 | Chen | H10W 42/121 |
| 2021/0343650 | A1 | 11/2021 | Peng | |
| 2023/0026676 | A1 | 1/2023 | Cheng | |
| 2023/0034737 | A1 | 2/2023 | Wang | |
| 2023/0369218 | A1 | 11/2023 | Li et al. | |
| 2024/0203968 | A1* | 6/2024 | Gandhi | H10W 90/00 |
| 2024/0311118 | A1 | 9/2024 | Malvankar et al. | |

OTHER PUBLICATIONS

Podpod, et. al., “A new approach to fan-out wafer-level packaging”, https://www.imec-int.com/en/imec-magazine/imec-magazine-june-2019/a-new-approach-to-fan-out-wafer-level-packaging, IMEC, Jun. 6, 2019, pp. 1-30.

Lau, “State-of-the-Art and Outlooks of Chiplets Heterogeneous Integration and Hybrid Bonding”, https://doi.org/10.4071/imaps.1542066, Journal of Microelectronics and Electronic Packaging, vol. 18, No. 4, 4th Qtr, 2021, pp. 145-160, Accessed Nov. 2, 2022.

Lau, “Recent Advances and Trends in Advanced Packaging”, Unimicron Technology Corporation, https://ewh.ieee.org/soc/cpmt/presentations/eps2204c.pdf, IEEE EPS Binghamton Chapter, Apr. 13, 2022, pp. 27-32, 87-89, 90-92.

Li, et al., “Interlevel via for Stacked Field-Effect Transistor Device”, U.S. Appl. No. 17/662,859, filed May 11, 2022, (Spec + Drawing) pp. 36.

Li, et al., “Transistors With Dual Power and Signal Lines”, U.S. Appl. No. 17/900,398, filed Aug. 31, 2022, (Specs + Drawings) pp. 39.

Malvankar, et al., “AI Based Operator Install Advisor” U.S. Appl. No. 18/183,127, filed Mar. 13, 2023, (Spec + Drawings) pp. 35.

Peters, “The Path to Known Good Interconnects”, Retrieved from https://semiengineering.com/the-path-to-known-good-interconnects/, Semiconductor Engineering, Jan. 19, 2023, pp. 1-11.

Tian, et. al., “Using Chiplet Encapsulation Technology to Achieve Processing-in-Memory Functions”, https://doi.org/10.3390/mi13101790, Micromachines, 2022, 13, 1790, Oct. 20, 2022, pp. 1-17.

Vivet, et. al., “IntAct: A 96-core Processor with Six Chiplets 3D-stacked on an Active Interposer with Distributed Interconnects and Integrated Power Management”, https://hal.science/hal-03072959, HAL open science, IEEE Journal of Solid-State Circuits, 2021, 56(1), submitted on Dec. 16, 2020, pp. 1-20.

* cited by examiner

OPTIONAL BREAKOUT A

OPTIONAL BREAKOUT B

DUAL-SIDE BRIDGE CHIPS CONNECTING TWO SEMICONDUCTOR CHIPS WITH STACKED SEMICONDUCTOR DEVICES

BACKGROUND

The disclosure relates generally to semiconductor device manufacturing. The disclosure relates particularly to using two bridge chips to connect at least two chips with stacked semiconductor devices.

The amount of data we process is rapidly increasing at a rate higher than that of Moore's law. Increasing system performance requirements, driven at least in part by the increasing use of artificial intelligence, continue to drive tighter pitches in semiconductor devices and smaller semiconductor chips. For logic scaling at the two-nanometer node, planar and non-planar semiconductor device structures, such as metal-oxide-semiconductor field-effect transistors (MOSFETs), must be scaled to smaller dimensions.

With the evolution of reduced-size transistors, semiconductor technology has progressed from planar transistor designs to three-dimensional type finFET designs which are further evolving into gate-all-around transistor designs. With increasing demands to reduce the dimensions of transistor devices, nanosheet field-effect transistors (FETs) help achieve a reduced device footprint while maintaining device performance. A nanosheet FET device contains one or more portions of layers of semiconductor channel material having a vertical thickness that is substantially less than its width. A typical nanosheet FET includes a plurality of stacked nanosheets extending between a pair of source/drain epitaxial regions. The nanosheet FET device may be a gate-all-around device in which a gate surrounds the channels of the nanosheet FET devices. Utilizing stacked nanosheets, Gate-All-Around nanosheet field-effect transistors (GAA nanosheet FETs) and 3D-stacked complementary metal-oxide semiconductor (CMOS) devices such as complementary field-effect transistor devices will be important to continue to extend beyond Moore's Law.

GAA nanosheet (or nanowire) FET devices are a viable option for continued device scaling. GAA nanosheet FET devices have been recognized as excellent candidates to achieve improved power performance and area scaling compared to FinFET technology. GAA nanosheet FET devices can provide high drive currents due to wide effective channel width (Weff) while maintaining short-channel control. However, in many cases, backside power delivery networks need to be coupled with GAA nanosheet FETs for performance and back-end-of-line (BEOL) wiring congestion issues.

The complementary field-effect transistor (CFET) is composed of two stacked complementary FETs, where the stacked complementary FET includes a p-type FET (PFET) and an n-type FET (NFET) that are vertically stacked. The CFET devices provide a further evolution of the gate-all-around (GAA) nanosheet transistor. Instead of stacking either n-type devices on top of other n-type devices or stacking p-type devices on other p-type devices as occurs with conventional vertically stacked GAA nanosheet transistors, CFET devices stack both n-type and p-type devices on top of each other. CFET stacked transistors offer a scaling path by stacking the NFET and PFET over each other, thereby providing an area benefit. Combined with appropriate interconnects, the CFET approach can effectively cut an inverter footprint in half, doubling the area density and further pushing the limits of Moore's Law.

Furthermore, as the semiconductor industry continues to drive to the two-nanometer technology node with tighter pitches and increasing performance, increased use of backside interconnect layers for a backside power delivery network is emerging. Creating backside interconnect layers below the front-end-of-line semiconductor devices provides improved power performance and more routing options for semiconductor devices relieving some of the BEOL wiring congestion. Utilizing a backside power delivery network can enable ten to thirty-five percent logic area scaling reduction in a two-nanometer technology node that utilizes GAA nanosheet FETs. A backside power delivery network improves semiconductor device gate delay and reduces BEOL wiring congestion.

Another evolving approach for designing semiconductor chips is the use of sub-elements of a complex-function chip that could be made as chiplets, where these sub-elements might include a separate computational processor or graphics unit, an AI accelerator, a I/O function, or a host of other chip functions. Moving away from the system-on-a-chip (SoC) model to use chiplets could change the future of semiconductor chip design. Since the earliest days of semiconductor chips, researchers have been working to make transistors smaller and cheaper. Fitting more and more transistors into a smaller area on semiconductor chips for SoC can increase the achievable compute power of semiconductor chips, can lower the cost to compute with the semiconductor chips, or can provide a combination of these two options. However, fitting all the functions you might want in a SoC could result in a semiconductor chip design that's too costly for the target market.

In some cases, the desired design object could be more efficiently done through mixing and matching individual components or sub-elements together with chiplets, rather than using a SoC or combining several SoCs. Because some chip functions have already achieved their optimum performance for their circuit size, shrinking these chip functions any further is not productive. In these cases, the use of chiplets for efficiently designed chip functions can be effective. The idea behind chiplets is to break apart the system on a chip into its composite functional chip design blocks, or sub-elements that can be mixed and matched in future semiconductor chip designs. Using chiplets with smaller design blocks can provide economic advantages along with design flexibility.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In aspects of the present invention, a semiconductor structure includes at least two chiplets, where each chiplet includes a top semiconductor device with frontside interconnect wiring, the top semiconductor device contacting a substrate with a plurality of through-silicon vias and a bottom semiconductor device with backside interconnect wiring. At least a first bridge chip connects to the first portion of the backside interconnect wiring in each of the two chiplets. The semiconductor structure includes at least a second bridge chip that connects the frontside interconnect wiring in each of the two chiplets to the substrate with the through-silicon vias. The top semiconductor device and the bottom semiconductor device in each of the two chiplets are electrically connected.

Aspects of the present invention disclose a method of forming a semiconductor structure with at least two bridge chips and at least two chiplets with two directly stacked semiconductor devices. The method includes forming at least a top semiconductor device contacting a bottom semiconductor device on each of two at least two first wafers, where the top semiconductor device includes frontside interconnect wiring. The method includes attaching a second wafer with through-silicon vias to each frontside interconnect wiring on each of the top semiconductor devices. The method includes removing each of the two first wafers and forming a backside interconnect wiring on each of the bottom semiconductor devices. The method includes dicing each second wafer with the plurality of through-silicon vias to form at least two chiplets. Each chiplet includes at least frontside interconnect wiring contacting the top semiconductor device, the top semiconductor device contacting the bottom semiconductor device with backside interconnect wiring, and the substrate with through-silicon vias formed from the diced second wafer with through-silicon vias. The method includes bonding a carrier wafer to at least two chiplets and forming a dielectric fill around each of the chiplets and on the carrier wafer. The method includes planarizing the dielectric fill to expose a surface of the backside interconnect wiring on each of at least two chiplets and attaching a first bridge chip to the backside interconnect wiring on each of at least two chiplets. The method includes dicing the carrier wafer with the chiplets to form the first semiconductor assembly and flipping the first semiconductor assembly. The method includes attaching a second bridge chip to the frontside interconnect wiring of each of at least two chiplets.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
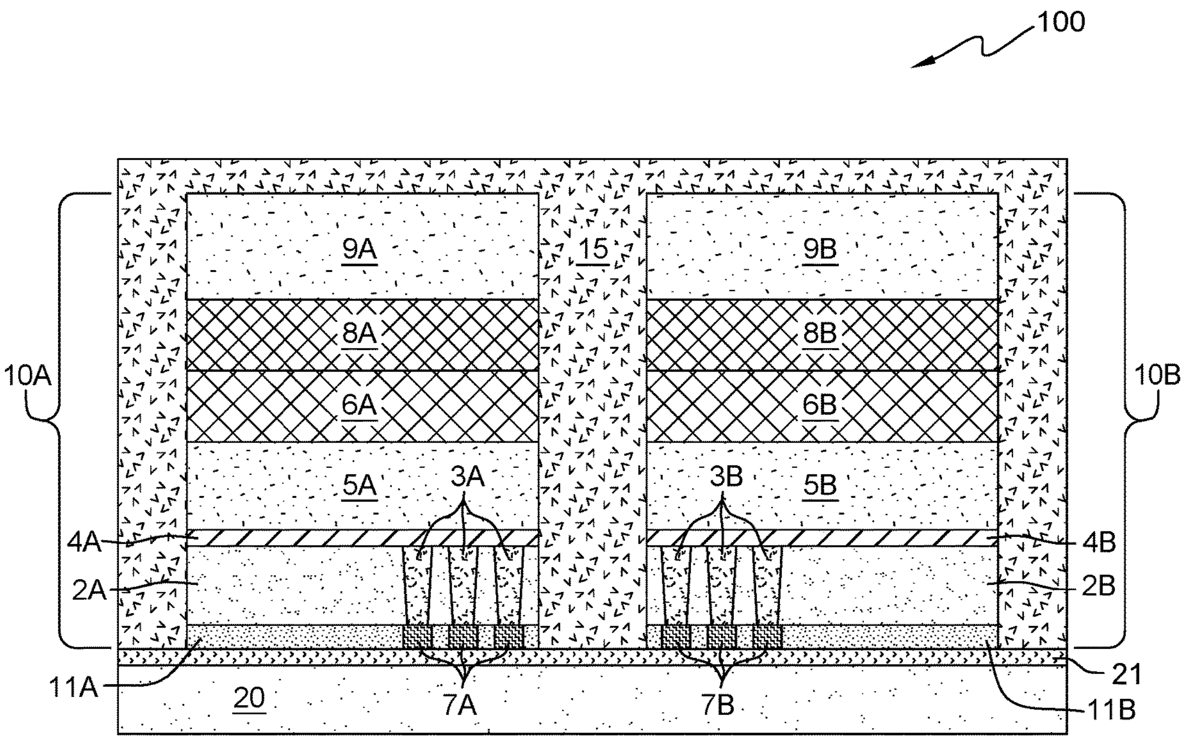
FIG. 1 depicts a cross-sectional view of a first sub-assembly of a semiconductor structure, in accordance with an embodiment of the present invention.

Aspects of the present invention provide a semiconductor structure with at least two chiplets, where each chiplet includes a top semiconductor device with frontside interconnect wiring contacting a substrate with a plurality of through-silicon vias, where the top semiconductor device directly contacts a bottom semiconductor device with backside interconnect wiring. Providing two or more chiplets with at least two stacked and directly connecting semiconductor devices where one semiconductor device has frontside wiring and the other semiconductor device has backside interconnect wiring reduces wiring congestion in the frontside interconnect wiring. The semiconductor structure also includes a first bridge chip connecting to a first portion of the backside interconnect wiring in each chiplet of the two chiplets. The first bridge chip connecting the first portion of the backside interconnect wiring in each chiplet of the two chiplets both improves the electrical performance of the two chiplets by reducing the length of the signal path between the bottom semiconductor devices in each chiplet of the chiplets and removes some of the wiring in each of the backside interconnect wiring of the two chiplets. The semiconductor structure also includes a packaging substrate that connects to a second portion of the backside interconnect wiring of each chiplet of the at least two chiplets in the semiconductor structure. The semiconductor structure includes the second bridge chip connecting the frontside interconnect wiring in each chiplet of the two chiplets to the substrate with the plurality of TSVs. Using the second bridge chip to connect each of the top semiconductor devices through the frontside interconnect wiring and TSVs in each of the two chiplets can reduce the signal path between the two top semiconductor devices and therefore, improves the electrical performance of the two chiplets. Additionally, using the second bridge can reduce the wiring in the two chiplets by moving some of the interconnect wiring into the second bridge chip. Additionally, one or both of the first bridge chip and the second bridge chip can include one or more passive devices and/or active devices to further improve chiplet performance and reduce the semiconductor device real estate needed in the two chiplets (e.g., some of the devices previously formed in either or both of the top semiconductor device and the bottom semiconductor device can be formed in the first bridge chip and/or second bridge chip). The semiconductor structure efficiently connects at least two chiplets with at least two stacked semiconductor devices and provides dual-side interconnections utilizing two bridge chips. The first bridge chip provides connections between the backside interconnect wiring of the two chiplets and the second bridge chip provides connections between the frontside interconnect wiring of the two chiplets. Using the semiconductor structure with at least two bridge chips increases the input/output (I/O) density of the semiconductor structure.

In embodiments, the top semiconductor device and the bottom semiconductor device in each chiplet of the two chiplets are electrically connected. The direct electrical connection of the two directly and vertically stacked semiconductor devices in each of the chiplets provides improved electrical performance of the chiplet and design flexibility for the chip and/or system designer.

In embodiments, the top semiconductor device and the bottom semiconductor device are each a different type of semiconductor device in each chiplet of the two chiplets. The ability to directly stack two different types of semiconductor devices in each of the chiplets can provide improved electrical performance for each of the chiplets and design flexibility for the chip and/or system designer.

In embodiments, the top semiconductor device and the bottom semiconductor device are each the same type of semiconductor device in each chiplet of the two chiplets. The ability to directly stack two of the same type of semiconductor devices in each of the chiplets may provide improved electrical performance and design flexibility for the chip and/or system designer.

In embodiments, the top semiconductor device is a memory device in each chiplet of the two chiplets and the bottom semiconductor device is a logic device in each of the two chiplets. The ability to directly stack two different types of semiconductor devices in each of the chiplets can provide improved electrical performance for each of the chiplets and design flexibility for the chip and/or system designer.

In other embodiments, the top semiconductor device in the first chiplet of the two chiplets is different from the top semiconductor device in the second chiplet of the two chiplets, and the bottom semiconductor device in each chiplet of the two chiplets are the same type of semiconductor device. The ability to directly stack two different types of top semiconductor devices over the same type of bottom semiconductor device in each of the chiplets can provide improved electrical performance for each of the chiplets and design flexibility for the chip and/or system designer.

In embodiments, the first bridge chip connects to the backside interconnect wiring of each chiplet of the two chiplets by a chip interconnection selected from the group of a hybrid bond or a plurality of micro-bumps. The ability to provide either a hybrid bond or micro-bumps provides semiconductor and assembly process options for creating a two chiplet assembly with the first bridge chip. In embodiments, the ability to provide a hybrid bond connecting the first bridge chip to the backside interconnect wiring provides a lower profile of the first bridge chip joined to each of the two chiplets which may eliminate a need for a cavity in the packaging substrate such as a printed circuit board.

In embodiments, the first bridge chip connects to the backside interconnect wiring of each chiplet of the two chiplets by a solder interconnection. Using a solder connection can provide a higher standoff or a variable standoff height for ease of cleaning under the bridge chip after connecting it to the frontside interconnect wiring. Using the solder connection to join the first bridge chip may reduce mechanical and/or thermal stresses on the bridge chip occurring during the attachment process with solder interconnections such as micro-bumps compared to a hybrid bonding process.

In embodiments, the semiconductor structure also includes a dielectric fill surrounding sidewalls in each chiplet of the two chiplets, a hybrid bond that connects a first portion of the backside interconnect wiring of each of the at least two chiplets to the first bridge chip, a plurality of solder bumps that connect a second portion of the backside interconnect wiring of each chiplet of the two chiplets to a packaging substrate, a first underfill material surrounds the plurality of solder bumps is between a bottom surface of the two chiplets, the first bridge chip, and the packaging substrate, a second underfill surrounds a plurality of microbumps and between the second bridge chip and a portion of the backside interconnect wiring, and a thermal interface material contacts the second bridge chip, exposed portions of the substrate of each chiplet of the two chiplets, and a heat sink. The underfill material provides mechanical and chemical protection of the surrounded interconnects and additionally, provides extra mechanical strength to the assembled semiconductor structure. The ability to provide heat sinks thermally connected to the chiplets can improve the electrical performance of each of the semiconductor devices by removing some of the thermal energy generated by the functioning of the semiconductor devices.

In embodiments, a dielectric fill surrounds the sidewall of each of the two chiplets, a plurality of micro-solder bumps connect a first portion of the backside interconnect wiring of each chiplet of the two chiplets to the first bridge chip, a plurality of pillars connect a second portion of the backside interconnect wiring to a plurality of package interconnections, a packaging substrate connects by the plurality of package interconnections to the plurality of pillars, a first underfill material is between a bottom portion of the two chiplets, under the two chiplets, surrounding the first bridge chip, the plurality of pillars, the plurality of micro-bumps, and over a second underfill material, and the second underfill material under the first underfill material and under the first bridge chip. The second underfill material surrounds the plurality of packaging interconnects and is between the first underfill material and the package substrate. A third underfill material is between the second bridge chip and each of the substrates with the plurality of through-silicon vias. The dielectric fill can provide mechanical strength to the semiconductor assembly and provide mechanical and chemical protection to the chiplets. The first, second, and third underfill materials provide mechanical and chemical protection to the micro-bumps, the pillars, and the package interconnections.

In embodiments, the substrate with the plurality of through-silicon vias in each chiplet of the at least two chiplets includes the plurality of through-silicon vias that are in adjacent outer edges of each substrate with the plurality of through-silicon vias in each chiplet of the at least two chiplets. Providing the through-silicon vias in adjacent outer edges of the substrate both reduces the size of the second bridge and reduces the distance that the electrical signals travel between the frontside interconnect wiring in each chiplet of the two chiplets. Reducing the distance between the frontside interconnect wiring on the top semiconductor device of each chiplet of the two chiplets can improve the electrical performance of the assembled semiconductor structure.

In embodiments, each of the plurality of through-silicon vias connects to a portion of the frontside interconnect wiring by a micro-bump. Using the micro-bump, which can be a micro-solder bump, rather than a hybrid bond, to join to the substrate with the plurality of vias to the second bridge chip, can provide a lower assembly temperature and may provide a higher standoff height for cleaning.

In embodiments, the second bridge chip connects the frontside interconnect wiring in each chiplet of the at least two chiplets by the plurality of micro-bumps, where the plurality of micro-bumps on each chiplet of the two chiplets connect to the plurality of through-silicon vias to the second bridge chip. Connecting each of the frontside interconnect wiring in the two chiplets using a second bridge chip which may include passive or active devices can reduce the number of devices in each of the two chiplets by moving some of the devices into the second bridge chip and may reduce electrical signal paths between the top semiconductor devices in the two chiplets.

Aspects of the present invention include a method of forming a semiconductor structure of a first semiconductor assembly where the method includes forming at least a top semiconductor device contacting a bottom semiconductor device on each chiplet of two first wafers where the top semiconductor device includes a frontside interconnect wiring, attaching a second wafer with a plurality of through-silicon vias to each of the frontside interconnect wiring on each of the two wafers, removing each of the two first wafers, forming a backside interconnect wiring on each of the bottom semiconductor devices, dicing each of the second wafers with the plurality of through-silicon vias to form at least two chiplets, where each chiplet includes at least the frontside interconnect wiring contacting the top semiconductor device, the top semiconductor device contacting the bottom semiconductor device with the backside interconnect wiring, and a portion of the second wafer with the plurality of through-silicon vias bonding a carrier wafer to the at least two chiplets, forming a dielectric fill around each chiplet of the at least two chiplets on the carrier wafer, planarizing the dielectric fill to expose a surface of the backside interconnect wiring on each chiplet of the at least two chiplets, attaching a first bridge chip to a first portion of the backside interconnect wiring on each chiplet of the at least two chiplets, removing the carrier wafer, attaching a printed circuit board to a second portion of the backside interconnect wiring of each chiplet of the at least two chiplets, attaching a second bridge chip to the frontside interconnect wiring of each chiplet of the at least two chiplets. The method effectively forms a semiconductor structure utilizing at least two bridge chips for dual-side interconnects between two chiplets or two chips with at least two vertically stacked semiconductor devices increasing I/O density.

In embodiments, planarizing the dielectric fill to expose the surface of the backside interconnect wiring on each chiplet of the at least two chiplets includes depositing a bond layer for hybrid bonding on the first portion of the backside interconnect wiring and forming solder bumps on the second portion of the backside interconnect wiring. Depositing a bond layer and forming solder bumps provides the ability to connect the backside interconnect wiring of each of the two chiplets to the first bridge chip and to a printed circuit board.

In embodiments, bonding the carrier wafer to each chiplet of the at least two chiplets includes using a removable bonding film to bond the carrier wafer to each chiplet of the at least two chiplets. Using the bonding film provides easy removal of the carrier wafer during the assembly of the semiconductor structure.

In embodiments, attaching the printed circuit board to the second portion of the backside interconnect wiring of each chiplet of the at least two chiplets includes applying a first underfill material on a packaging substrate. The first underfill material protects the package interconnections.

In embodiments, attaching the second bridge chip to the frontside interconnect wiring of each chiplet of the at least two chiplets includes applying an underfill material under the second bridge chip and providing a thermal interface material that contacts the second bridge chip, an exposed portion of a substrate of each chiplet of the two chiplets, and a heat sink. The second underfill material protects the connections to the second bridge chip and the thermal interface material aides in the removal of the semiconductor device generated thermal energy or heat.

In embodiments, forming the top semiconductor device contacting the bottom semiconductor device includes selecting the top semiconductor device from the group of semiconductor devices consisting of a logic device and a memory device and selecting a bottom semiconductor device from the group of semiconductor devices consisting of the logic device and the memory device. The method of forming different types of top and bottom semiconductor devices in each of the two chiplets provides chip design flexibility.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. In embodiments of the invention, include the description of how to efficiently connect at least two chiplets or two chips with at least two vertically stacked semiconductor devices that have interconnections using at least one bridge chip on each side of each of the two chiplets forming dual-side interconnections for the two chiplets. The dual-side connections to the two chiplets are created by a top bridge chip connecting to the substrate with the plurality of through-silicon vias in each of the two chiplets and a bottom bridge chip connecting to the backside interconnect wiring of each of the two chiplets. Using at least two bridge chips connected to the top and bottom of each of the two chiplets can provide easier semiconductor device manufacturing processes and can increase the I/O density of the assembled chiplets or assembled chips utilizing the two bridge chips.

Detailed embodiments of the claimed structures and methods are disclosed herein. The method described below does not form a complete process flow for manufacturing integrated circuits, such as semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

Reference is now made to the figures. The figures provide schematic cross-sectional illustrations of semiconductor devices at intermediate stages of fabrication, according to one or more embodiments of the invention. The device provides schematic representations of the devices of the invention and are not to be considered accurate or limiting with regard to device element scale.

FIG. 1 depicts a cross-sectional view of first sub-assembly 100 of a semiconductor structure, in accordance with an embodiment of the present invention.

As depicted in FIG. 1, first sub-assembly 100 of a semiconductor structure includes chiplet 10A and chiplet 10B. In FIG. 1, chiplet 10A and chiplet 10B are each attached by bonding layer 21 to carrier wafer 20. Both chiplet 10A and chiplet 10B are surrounded by dielectric fill 15 that is on the exposed surfaces of bonding layer 21. As known in the art, a chiplet is a tiny integrated circuit (IC) that contains a well-defined subset of functionality. A chiplet is typically designed to be combined with other chiplets on an interposer with fanout wiring, on a bridge chip, or another known advanced packaging technology in a single package. In some embodiments, chiplet 10A and chiplet 10B are each a semiconductor chip.

In various embodiments, chiplet 10A includes backside interconnect wiring 9A, bottom device 8A, top device 6A, frontside interconnect wiring 5A bonded by bond 4A, to substrate 2A with TSVs 3A. In various embodiments, chiplet 10B includes backside interconnect wiring 9B, bottom device 8B, top device 6B, frontside interconnect wiring 5B bonded by bond 4B, to substrate 2B with TSVs 3B. In some embodiments, each of chiplet 10A and chiplet 10B are each a semiconductor chip, where each semiconductor chip can be composed of at least the two stacked semiconductor devices, for example, as a system on a chip (e.g., top device 6A stacked with bottom device 8A and top device 6B stacked with bottom device 8B), frontside interconnect wiring, backside interconnect wiring, substrate 2A and substrate 2B with TSVs 3A and 3B, respectively). In various embodiments, top device 6A is stacked with and directly contacts bottom device 8A. Similarly, top device 6B is vertically stacked with and directly contacts, both physically and electrically, bottom device 8B in various embodiments. As known to one skilled in the art and for the purposes of the present invention, top device 6A, top device 6B, bottom device 8A, and bottom device 8B are each a semiconductor device.

Top device 6A with frontside interconnect wiring 5A bonds by hybrid bonding of bond 4A, for example, to substrate 2A. Top device 6A with frontside interconnect wiring 5A and bottom device 8A with backside interconnect wiring 9A are labeled as chiplet 10A.

Frontside interconnect wiring 5A can attach to substrate 2A by bond 4A, using hybrid bonding, for example, although other known methods of bonding wafers-to-wafers may be used in other examples. Bond 4A can be a hybrid bond but is not limited to this type of bond. Hybrid bonding is a known method of forming a permanent bond that combines a dielectric bond (SiOx) with embedded metal (Cu) to form interconnections commonly known as direct bond interconnections. Bond 4A connecting capture pads 7A on TSVs 3A to corresponding interconnect pads (not depicted) on frontside interconnect wiring 5A. Electrical connections can be made from frontside interconnect wiring 5A to bond 4A and TSVs 3A by hybrid bonding or other known wafer-to-wafer bonding process. Bond 4A provides both a mechanical bond between substrate 2A and frontside interconnect wiring 5A and electrical connections between TSVs 3A and frontside interconnect wiring 5A.

TSVs 3A are covered by capture pads 7A in dielectric layer 11A that can be aligned and joined, for example by bond 4A and hybrid bonding, to corresponding bond pads (not depicted) on frontside interconnect wiring 5A. Similarly, TSVs 3B have capture pads 7B in dielectric layer 11B. In various embodiments, TSVs 3A and TSVs 3B are in adjacent outer edges of substrate 2A and substrate 2B, respectively, after bonding substrate 2A and substrate 2B to frontside interconnect wiring 5A and 5B, respectively, using hybrid bonding of bonds 4A and 4B.

Chiplet 10B like chiplet 10A includes at least two stacked semiconductor devices. As depicted in FIG. 1, chiplet 10B includes top device 6B with frontside interconnect wiring 5B bonded to substrate 2B and bottom device 8B with backside interconnect wiring 9B where frontside interconnect wiring 5B connects to substrate 2B by bonds 4B. Frontside interconnect wiring 5B with interconnect bond pads (not depicted) bonds to capture pads 7B on TSVs 3B using one of the bonding processes discussed above with respect to chiplet 10A (e.g., hybrid bonding). As depicted, frontside interconnect wiring 5B bonds by bond 4B to substrate 2B with TSV 3B that are covered by capture pads 7B in dielectric layer 11B. Bond 4B can be a hybrid bond that provides both mechanical bonds and electrical connections between substrate 2B with TSVs 3B and frontside interconnect wiring 5B.

As depicted in FIG. 1, both dielectric layer 11A with capture pads 7A under TSVs 3A and dielectric layer 11B with capture pads 7B under TSVs 3B attach by bonding layer 21 to carrier wafer 20. Bonding layer 21 can be a layer of any known bonding film, adhesive, or other material used to bond two semiconductor structures or wafers together. In some cases, bonding layer 21 can be composed of more than one layer of material (e.g., a multilayer oxide or a multilayer polymer). Bonding layer 21 can attach carrier wafer 20 to dielectric layer 11A with capture pads 7A, dielectric fill 15, and dielectric layer 11B with capture pads 7B, as depicted in FIG. 1. In various embodiments, bonding layer 21 is a removable film so that carrier wafer 20 can be easily detached in later processes.

As depicted in FIG. 1, dielectric fill 15 covers the exposed surfaces of chiplet 10A, chiplet 10B, substrate 2A, substrate 2B, and bonding layer 21 on wafer 20. In one embodiment, dielectric fill 15 is over the exposed surfaces of chiplet 10A and chiplet 10B and is between chiplet 10A and chiplet 10B (e.g., does not cover the outer sidewalls of chiplet 10A and chiplet 10B). Dielectric fill 15 can be one or more layers of an organic dielectric material such as but not limited to spin-on polymers, epoxies, polyimide, and epoxy mold compounds, an inorganic material such as but not limited to oxides, nitrides, oxynitrides, silicon, and germanium, or a combination of these material layers. Dielectric fill 15 can be deposited by spin-coating, chemical or physical vapor deposition, atomic layer deposition, or other known deposition process for a dielectric fill.

Top device 6A, and bottom device 8A, as depicted in FIG. 1, can compose two stacked devices in chiplet 10A. Top device 6A and top device 6B with frontside interconnect wiring 5A and 5B. respectively, bottom device 8A and bottom device 8B with backside interconnect wiring 9A and 9B, respectively, can be formed using any known semiconductor manufacturing processes for forming stacked semiconductor devices with frontside and backside interconnect wiring. The stacked semiconductor devices may be formed on a single original or first wafer as in the case of the semiconductor processes for creating a complimentary field-effect transistor or CFET (e.g., using stacked nanosheet layers) or on two single first wafers with a layer of semiconductor devices where the semiconductor devices are joined or bonded together using known semiconductor bonding processes, and one wafer is removed to form a backside power delivery network or backside interconnect wiring. In another example, bottom device 8A can be formed on top device 6A using a known semiconductor layer transfer process which may be known as a monolithic process approach. Top device 6B with frontside interconnect wiring 5B bonded to substrate 2B and bottom device 8B and backside interconnect wiring 9B, as depicted, can compose two stacked devices of chiplet 10B. In various embodiments, top device 6A and top device 6B electrically connect with bottom device 8A and bottom device 8B, respectively. In an embodiment, more than two semiconductor devices may be vertically stacked in chiplet 10A and chiplet 10B.

In various embodiments, the two stacked semiconductor devices in each of chiplets 10A and 10B are different types of devices. For example, top device 6A can be a memory device stacked with a logic device for bottom device 8A in chiplet 10A, and top device 6B is a memory device stacked with a logic device for bottom device 8B in chiplet 10B. In another example, top device 6A can be a memory device formed with 14 nm node processes (e.g., has at least some semiconductor device features or elements with a 14 nm size) and bottom device 8A can be a memory or a logic device formed using another processing node such as formed using 5 nm node processes (e.g., has at least some semiconductor device features or elements with a 5 nm size). In this example, top device 6B and bottom device 8B can be a memory device formed with 14 nm node processes and a logic device formed with 5 nm node processes. In another example, top device 6A and top device 6B are memory devices formed using the 5 nm processing node while bottom device 8A and bottom device 8B are formed using the 14 nm processing node.

In other embodiments, the top devices in the two semiconductor chiplets 10A and 10B are different types of devices as are the bottom devices. For example, top device 6A is a memory device, and top device 6B is a logic device while bottom device 8A is a logic device and bottom device 8B is a memory device. In one embodiment, top device 6A and bottom device 8A are the same type of device (e.g., CMOS over CMOS device). Similarly, top device 6B and bottom device 8B may be the same type of device. In another embodiment, top device 6A and top device 6B are different types of semiconductor devices (e.g., a memory device and a logic device) and bottom device 8A and 8B are both the same type of semiconductor devices (e.g., both are logic devices). The combinations of top device 6A and bottom device 8A in semiconductor in semiconductor chiplet 10B chiplet 10A and top device 6B and bottom device 8B are examples for the purpose of illustration of some of the possible device combinations and are not intended to be limiting. As known to one skilled in the art, other types of devices can be formed for top device 6A, top device 6B, bottom device 8A, bottom device 8B, and in the combinations of these devices in electrically connected stacked semiconductor devices.

After forming top device 6A with and bottom device 8A, for example, using known CFET manufacturing processes on a first wafer (not depicted), frontside interconnect wiring 5A can be formed. Using hybrid bonding, for example, substrate 2A with TSVs 3A attaches as a permanent carrier wafer to frontside wiring 5A. A wafer flip of the first wafer occurs, and the first wafer removal can occur. After removing the first wafer, the formation of backside interconnect wiring 9A can occur. After forming the backside interconnect wiring 9A, the semiconductor structure, which is an assembly including top device 6A, bottom device 8A, frontside interconnect wiring 5A with substrate 2A bonded to frontside interconnect wiring 5A, backside interconnect wiring 9A, can be diced to form chiplet 10A, which can be a semiconductor chip in some embodiments. Similarly, with these processes, the semiconductor structure including the assembly with top device 6B, frontside interconnect wiring 5B, substrate 2B, bottom device 8B, and backside interconnect wiring 9B can be diced forming chiplet 10B, which also can be known as a semiconductor chip with one or more stacked semiconductor devices. After dicing chiplet 10A and chiplet 10B, carrier wafer 20 may be bonded by bond layer 21 to substrate 2A and substrate 2B, as depicted in FIG. 1. Dielectric fill 15 is formed on carrier wafer 20 and around chiplet 10A and chiplet 10B.

Substrate 2A and 2B can be composed of any type of semiconductor material. In various embodiments, substrate 2A and 2B are composed of one of silicon or silicon germanium. In some embodiments, substrate 2A and substrate 2B are portions of a single wafer. The single wafer can be diced with chiplet 10A and chiplet 10B forming substrate 2A and substrate 2B as depicted in FIG. 1. In other embodiments, substrate 2A and substrate 2B are different wafers with TSVs 3A and 3B, respectively. In an embodiment, substrate 2A and 2B are composed of an inorganic material, such as silicon oxide or ceramic or an organic material with a low thermal coefficient of expansion. In various embodiments, substrate 2A and substrate 2B include TSVs 3A and TSVs 3B, respectively.

In an alternative process for forming TSVs 3A, substrate 2A with vias partially extending into substrate 2A is attached in place of substrate 2A with TSVs 3A. In this alternative process, using a grinding process, a top portion of substrate 2A is removed to expose the vias and form TSVs 3A. This alternative process is depicted later and discussed with reference to FIGS. 8 and 9. As known to one skilled in the art, other known semiconductor processes can be used to form sub-assembly 100 depicted in FIG. 1.

Figure 2:
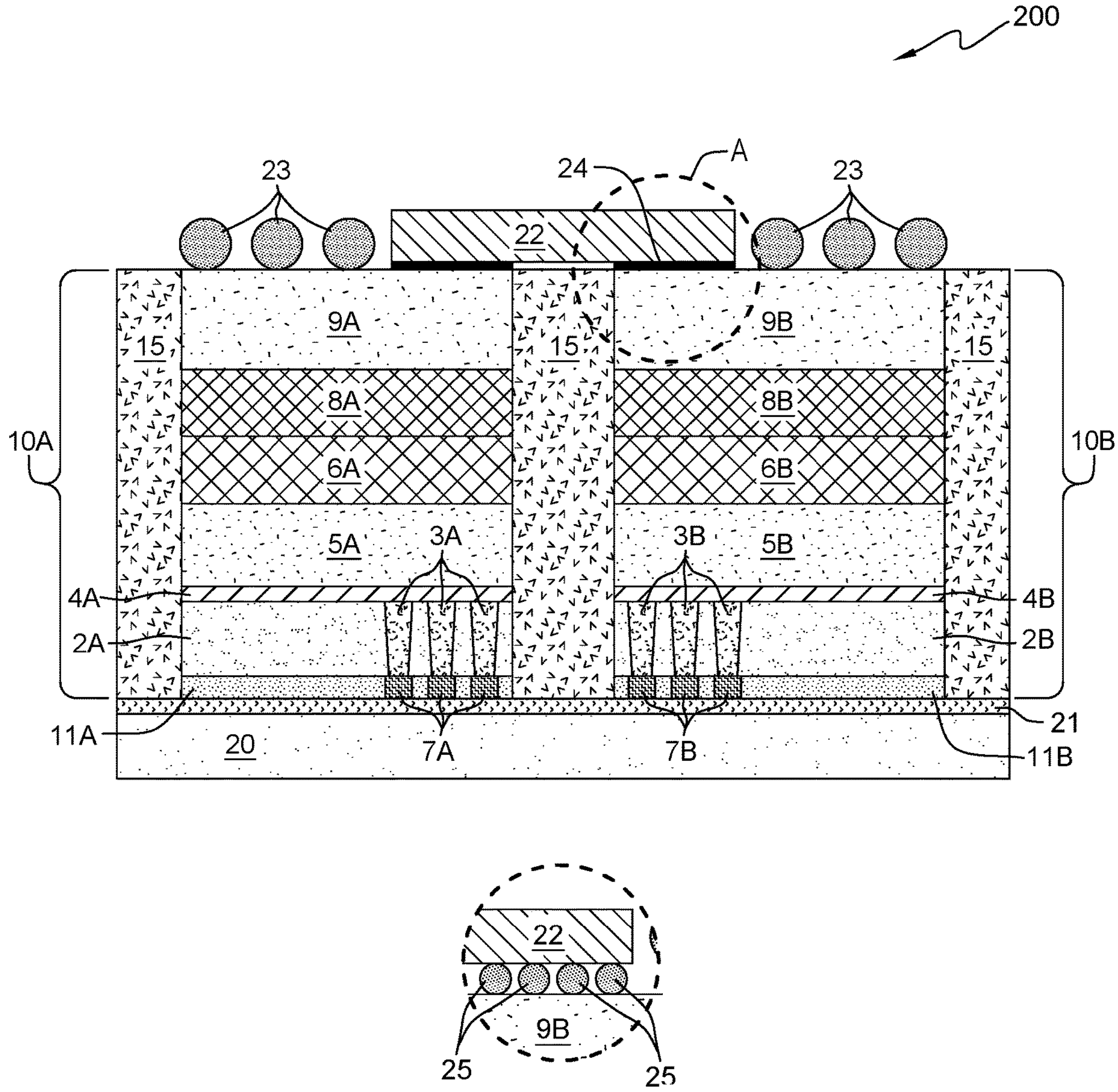
FIG. 2 depicts a cross-sectional view of a second sub-assembly of the semiconductor structure with a first bridge chip, in accordance with an embodiment of the present invention.

FIG. 2 depicts a cross-sectional view of second sub-assembly 200 of a semiconductor structure, in accordance with an embodiment of the present invention. As depicted, FIG. 2 includes the elements of FIG. 1 and bridge chip 22 attaching by hybrid bond 24 to chiplet 10A and chiplet 10B along with interconnect bumps 23 on a second portion of backside interconnect wiring 9A of chiplet 10A and the second portion of backside interconnect wiring 9B of chiplet 10B. The second portion of backside interconnect wiring 9A and 9B can be along opposite edges of chiplet 10A and chiplet 10B (e.g., on the opposing far sides of chiplet 10A and chiplet 10B that are away from the center of chiplet 10A and chiplet 10B). FIG. 2 also illustrates optional breakout A depicting micro-bumps 25 formed on either bridge chip 22 or on the first portion of backside interconnect wiring 9A and the first portion of frontside interconnect wiring 9B. In various embodiments, bridge chip 22 is joined to backside interconnect wiring 9A and backside interconnect wiring 9B of chiplet 10A and chiplet 10B, respectively, by one of hybrid bond 24 as depicted in FIG. 2, micro-bumps 25 as depicted in optional breakout A, or another suitable structure (e.g., adhesive paste, copper-to-copper bonding, or micro-wire connector material).

In various embodiments, bridge chip 22 provides electric signal connections between chiplet 10A and chiplet 10B using one or more wiring layers (not depicted) in bridge chip 22 through either hybrid bond 24 or micro-bumps 25. Bridge chip 22 can be composed of a semiconductor material that can provide one or more layers of wiring for signal distribution. In some embodiments, bridge chip 22 includes passive devices (e.g., capacitors, resistors, inductors). In another embodiment, bridge chip 22 includes active devices such as FETs. In some cases, bridge chip 22 may include both passive devices and active devices. In one embodiment, bridge chip 22 is composed of an organic material (e.g., laminate printed circuit board or a polymer carrier such as polyimide) or an inorganic material (e.g., ceramic, $SiO_2$).

In various embodiments, bridge chip 22 is composed of a semiconductor material with one or more wiring layers for re-distribution and connective wiring between chiplet 10A and chiplet 10B. Bridge chip 22 can provide electrical connections between backside interconnect wiring 9A and backside interconnect wiring 9B. Bridge chip 22 can provide electrical signals or in some cases, power can be transmitted through to and/or from chiplet 10A to chiplet 10B. In some embodiments, bridge chip 22 includes one or more active devices such as repeaters (inverters), input/output (I/O) devices, regulators, logic, or programmable gate arrays but is not limited to these active devices. In an embodiment, bridge chip 22 includes one or more passive devices and may also include active devices. In other embodiments, bridge chip 22 is composed of another material such as an inorganic material (e.g., ceramic) or an organic material (e.g., a thin printed circuit board with one to five layers, a polymer substrate with wiring and/or circuits/passive devices).

Bridge chip 22 may be joined to chiplet 10A and chiplet 10B after bonding carrier wafer 20 to carrier substrates 2A and 2B using known wafer bonding processes. Bridge chip 22 connects to the first portion of backside interconnect wiring 9A and the first portion of backside interconnect wiring 9B where the first portions of backside interconnect wiring 9A and 9B are adjacent to each other and are separated by dielectric fill 15. As depicted in FIG. 2, in one embodiment, bridge chip 22 connects to the first portions of backside interconnect wiring 9A and the first portion of backside interconnect wiring 9B by hybrid bond 24.

Bumps 23 can be any type of bumps or balls for joining a semiconductor chip or a chiplet, such as chiplet 10A or chiplet 10B, by interconnect pads on backside interconnect wiring 9A or backside interconnect wiring 9B, respectively to a packaging substrate (e.g., a printed circuit board). In various embodiments, bumps 23 are controlled collapse chip connections also known as C4s. In other embodiments, bumps 23 are metal bumps such as solder bumps formed with solder balls, copper pillars in solder, or metal surfaces such as gold, gold/tin, tin/bismuth for thermal compression bonding. Bumps 23 can have a height with a range of 10 to 30 um but are not limited to this range. Bumps 23 can be formed with any known process (e.g., C4 formation processes, solder balls, or electro-plating).

In another embodiment, depicted in optional breakout A, bridge chip 22 connects to the first portion of backside interconnect wiring 9A and the first portion of backside interconnect wiring 9B by micro-bumps 25. While optional breakout A depicts micro-bumps 25 on one edge or first portion of backside interconnect wiring 9B, micro-bumps 25 are present on the opposing edge or first portion of backside interconnect wiring 9A. Optional breakout B depicted later similarly provide micro-bumps 25 on both backside interconnect wiring 9A and 9B. Micro-bump 25 can be a micro-C4, a small solder bump or ball, or a layered combination of metal materials for a chip bond to interconnect pads (not depicted) on frontside interconnect wiring 9A and backside interconnect wiring 9B. Micro-bumps 25 can have a height that is 30 to 70 percent less than the height of bumps 23. Bumps 23 can be, for example, solder bumps, solder balls, or a controlled collapse chip connection (C4) formed using known chip interconnect formation processes (e.g., solder plating, solder screening, solder balls, or other metal alloy deposition process) and materials.

In other embodiments, more than one bridge chip (i.e., two of bridge chip 22) attach to more than two semiconductor chips by micro-bumps 25 or hybrid bond 24 (e.g., chiplet 10A and chiplet 10B attach to bridge chip 22 and a second bridge chip (not depicted) attaches to chiplet 10A and a third semiconductor chip (not depicted) or a second bridge chip (not depicted) also attaches to chiplet 10A and chiplet 10B).

As previously discussed, one of hybrid bond 24 (depicted in FIG. 2) or micro-bumps 25 (depicted in optional breakout A) attach bridge chip 22 to chiplet 10A and chiplet 10B. A bonding layer for hybrid bond 24 may be formed on either bridge chip 22 or on the inside-facing center edge portions of chiplet 10A and chiplet 10B. Hybrid bond 24 can be formed using known hybrid bonding processes and materials.

Micro-bumps 25 can be any type of small bumps for joining a semiconductor chip or chiplet such as chiplet 10A or chiplet 10B to backside interconnect wiring 9A and backside interconnect wiring 9B, respectively. In various embodiments, micro-bumps 25 are solder bumps. For example, micro-bumps 25 may be micro-C4s, electro-deposited, solder balls, or atomic layer deposited reflowable material such as but not limited to solder. Micro-bumps 25 can be very small solder-coated copper balls or pillars. Micro-bumps 25 may have a height that is 35 to 70 percent less than the height of bumps 23 but are not limited to this height. Micro-bumps 25 can be formed with any known process for forming interconnections on a semiconductor device (e.g., known solder balls formation processes such as electroplating or known C4 formation processes). In some cases, micro-bumps 25 can be plated or deposited metals for thermal compression bonding or can be dendritic plated surfaces for a dendrite connector (e.g., gold or gold-coated copper dendrites. In some embodiments, the deposition of micro-bumps 25 can occur using the same conductive material or metal as bump 25 (e.g., solder). In some cases, micro-bumps 25 and bumps 23 can be composed of two metal materials such as solder materials with a different composition and different melting points or reflow temperatures, and may be deposited by two different processes (e.g., C4 processes for bumps 23 and metal plating for micro-bumps 25).

Micro-bumps 25 or the bond layer for hybrid bond 24 can be formed on the facing or adjacent portions of backside interconnect wiring 9A and backside interconnect wiring 9B on the top surfaces of chiplet 10A and chiplet 10B. Micro-bumps 25 may be formed on interconnect pads (not depicted) on the surface of each of backside interconnect wiring 9A and backside interconnect wiring 9B adjacent to the gap filled with dielectric fill 15 between chiplet 10A and chiplet 10B. In some cases, micro-bumps 25 may be deposited or formed adjacent to the center of the middle facing edges of chiplet 10A and chiplet 10B as depicted in FIG. 2 although the location of micro-bumps 25 is not limited to this location (e.g., micro-bumps 25 are formed on one side of the backside interconnect wiring not in the center portion of the gap between chiplet 10A and chiplet 10B). As depicted in FIG. 2, micro-bumps 25 or the bond layer for hybrid bond 24 may be formed over interconnect pads (not depicted) on the leftmost outside portion of chiplet 10A and to the rightmost outside of chiplet 10B. As previously discussed, micro-bumps 25 can be less than one-half of the height of bumps 23 but are not limited to this size. As previously discussed, micro-bumps 25 or hybrid bond 24 can be formed over the portions of backside interconnect wiring 9A and backside interconnect wiring 9B. In some cases, micro-bumps 25 or hybrid bond 24 may cover approximately 15 to 70 percent of the width of each of backside interconnect wiring 9A and backside interconnect wiring 9B as measured from the adjacent facing edges of chiplet 10A and 10B, respectively. Similarly, surfaces of backside interconnect wiring 9A and 9B not covered by micro-bumps 25 or hybrid bond 24 may have bumps 23 periodically formed on exposed interconnect pads (e.g., bumps 23 may be formed over approximately 50 to 85 percent of the surfaces of chiplet 10A and chiplet 10B). For example, bridge chip 22 can be connected to micro-bumps 25 on chiplet 10A and chiplet 10B, using known chip interconnect bonding processes such as but not limited to a mass C4 solder reflow process of micro-bumps 25.

Figure 3:
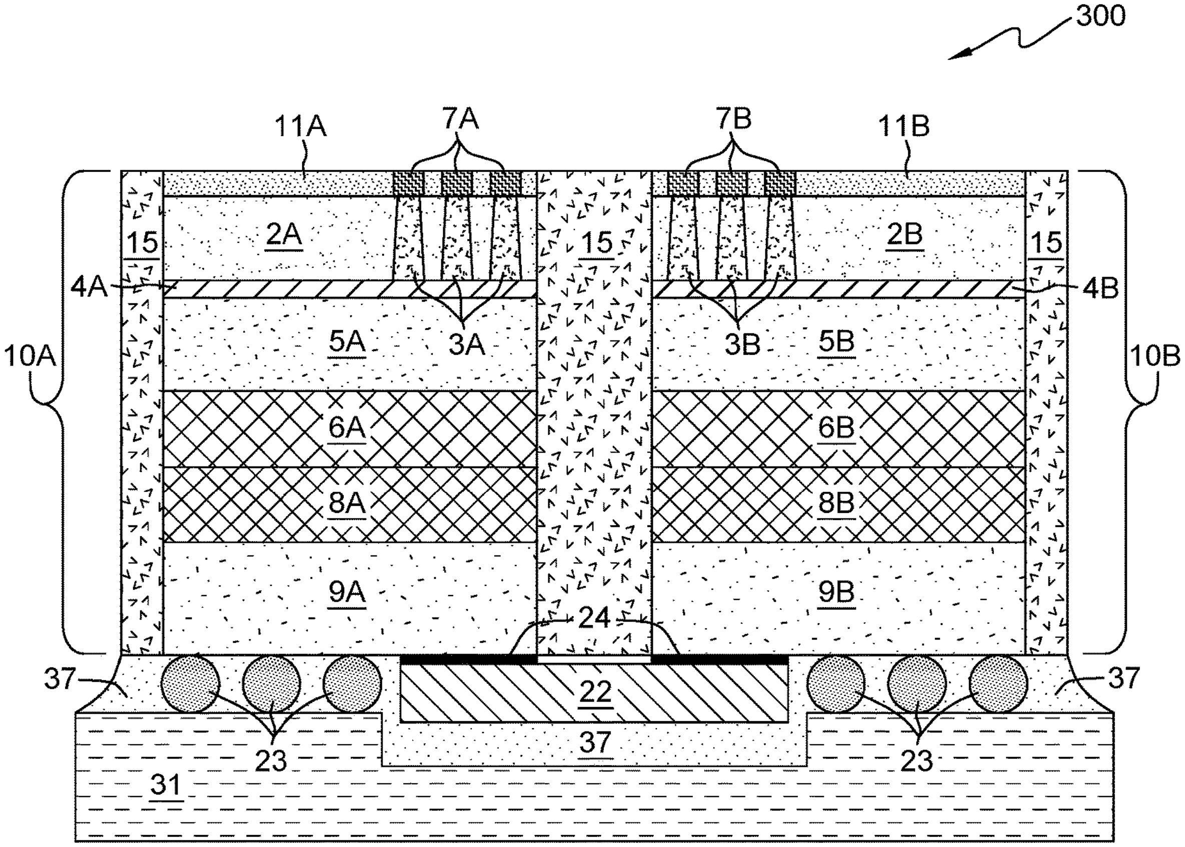
FIG. 3 depicts a cross-sectional view of a third sub-assembly of the semiconductor structure after flipping a carrier wafer, joining each of two semiconductor chips to a printed circuit board by C4 bumps, in accordance with an embodiment of the present invention.

FIG. 3 depicts a cross-sectional view of third sub-assembly 300 of the semiconductor structure after flipping carrier wafer 20, joining each of chiplet 10A and chiplet 10B to printed circuit board (PCB) 31 by bumps 23, in an embodiment of the present invention. In other cases, chiplet 10A and chiplet 10B may have direct signal and/or power connections to PCB 31 or another type of packaging substrate (e.g., a ceramic or flex substrate). As depicted, FIG. 3 includes the elements of FIG. 2 with PCB 31 and underfill 37.

After flipping carrier wafer 20, bumps 23 can be connected to backside interconnect wiring 9A and backside interconnect wiring 9B, for example, using a known solder reflow process, such as a mass reflow process for C4s or another known semiconductor interconnection process to join bumps 23 to PCB 31. In various embodiments, PCB 31 includes a cavity or recess in the center portion of PCB 31 corresponding to the location of bridge chip 22. The dimensions of the cavity in PCB 31 are large enough to allow bridge chip 22 to reside in the cavity without contacting PCB 31. In other examples, PCB 31 does not include a cavity and has a planar or flat surface. In this example, bridge chip 22 is a very thin chip and bumps 23 have a height sufficiently large that after solder reflow, bridge chip 22 remains above the top surface of PCB 31.

As depicted in FIG. 3, underfill 37 is deposited and flows over the exposed bottom surfaces of PCB 31, around a bottom portion of the sides of PCB 31 adjacent to micro-bumps 25, around and/or under bridge chip 22, surrounding bumps 23, and under a bottom surface of backside interconnect wiring 9A and backside interconnect wiring 9B of chiplet 10A and chiplet 10B, respectively. In an embodiment, underfill 37 is under and around micro-bumps 25 attaching bridge chip 22 to backside interconnect wiring 9A and 9B. Underfill 37 can be composed of any known chip underfill material and deposited using known underfill deposition processes.

As depicted in FIG. 3, bridge chip 22 is connected to both chiplet 10A and chiplet 10B and resides in a cavity in PCB 31. As depicted in FIG. 3, third sub-assembly 300 includes bridge chip 22, hybrid bond 24, chiplet 10A with substrate 2A with TSVs 3A, chiplet 10B, with substrate 2B with TSVs 3B, dielectric fill 15, bumps 25, underfill 37 and PCB 31. Carrier wafer 20 may be removed by releasing bonding layer 21 either before or after chiplet 10A and chiplet 10B are connected by bumps 23 to PCB 31.

Figure 4:
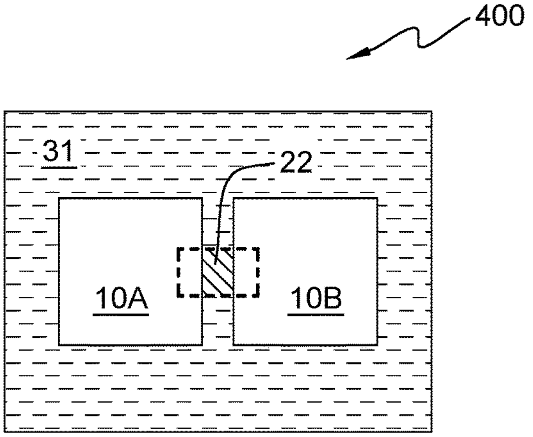
FIG. 4 depicts a top schematic view of an example of the functional elements of the third sub-assembly depicted in FIG. 3, in accordance with an embodiment of the present invention.

FIG. 4 depicts a top schematic view 400 of an example of the functional elements of the third sub-assembly 300 depicted in FIG. 3, in accordance with an embodiment of the present invention. As depicted, FIG. 4 includes chiplet 10A and chiplet 10B on PCB 31 and a dashed line indicating the outline of bridge chip 22 under chiplet 10A and chiplet 10B. In other examples, bridge chip 22 may be wider, may be longer, may be located more to one side or the other side, or located further up or down in FIG. 4. In one embodiment, as previously discussed, more than one bridge chip 22 is present connecting chiplet 10A and chiplet 10B. For example, two or more of bridge chips 22 can be attached to backside interconnect wiring 9A and backside interconnect wiring 9B.

Figure 5:
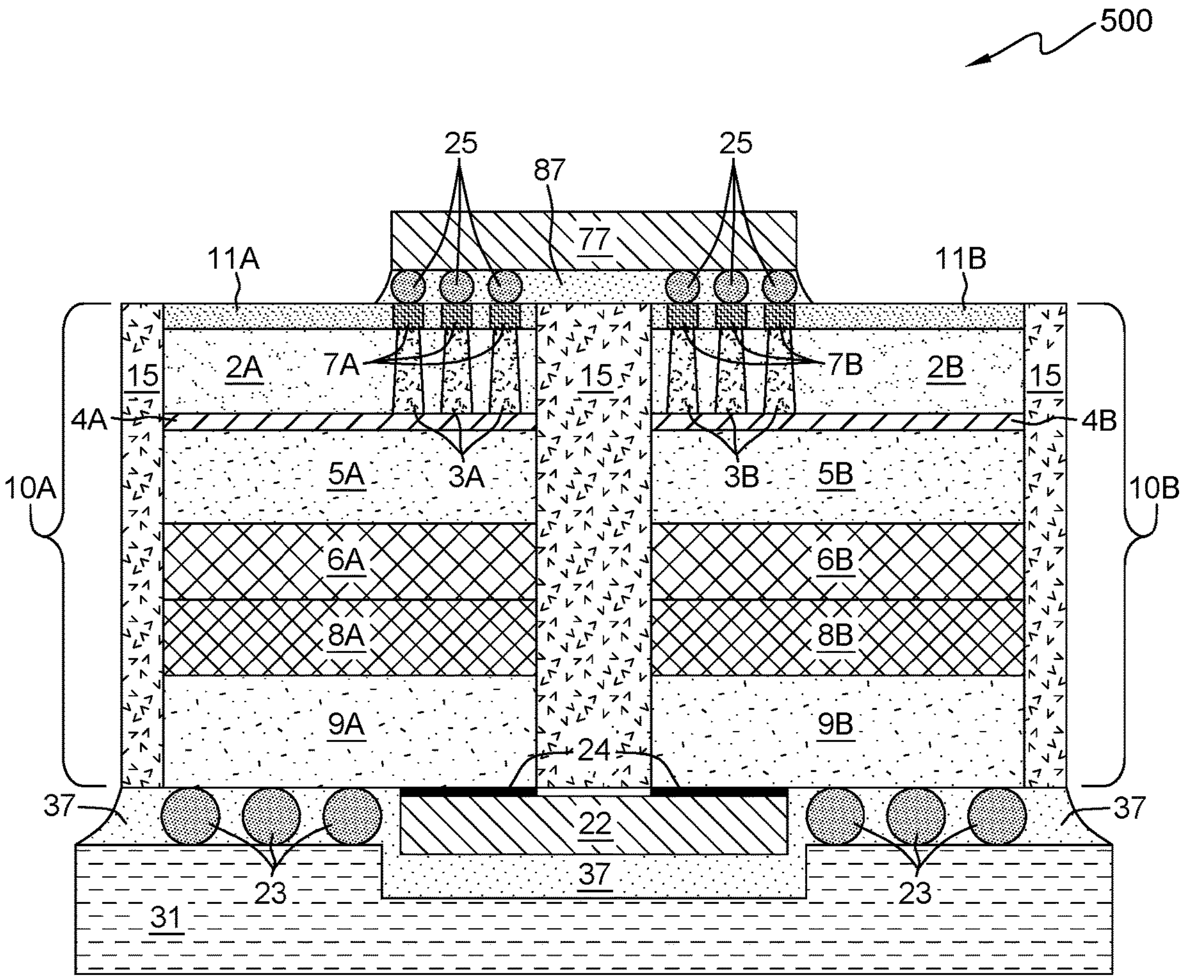
FIG. 5 depicts a cross-sectional view of a fifth sub-assembly of the semiconductor structure after attaching a second bridge chip to the two semiconductor chips, in accordance with an embodiment of the present invention.

FIG. 5 depicts a cross-sectional view of fifth sub-assembly 500 of the semiconductor structure after attaching bridge chip 77 to chiplet 10A and chiplet 10B and applying underfill 87 to third sub-assembly 300, in accordance with an embodiment of the present invention. As depicted, FIG. 5 includes the elements of FIG. 3 with bridge chip 77 attached by micro-bumps 25 to capture pads 7A and capture pads 7B and with underfill 87.

Using one or more known mass reflow processes such as a C4 or other solder reflow process, thermal compression bonding, or another suitable bonding process, micro-bumps 25 join bridge chip 77 to chiplet 10A and chiplet 10B by micro-bumps 25. As depicted, micro-bumps 25 can be formed on opposing outer portions of the surface of bridge chip 77 or on inside center portions of substrate 2A and 2B, as depicted in FIG. 5, corresponding to capture pads 7A and 7B, respectively. Underfill 87 surrounds micro-bumps 25 and exposed bottom surfaces of bridge chip 77 and a portion of the upper surfaces of dielectric layer 11A and 11B adjacent to micro-bumps 25. In FIG. 5, bridge chip 77 is directly over bridge chip 22. In other examples, bridge chip 77 is offset (e.g., to the left or the right of bridge chip 22). In yet other examples, bridge chip 77 is a different size than bridge chip 22. For example, bridge chip 77 is 10 to 50% longer than bridge chip 22. In some embodiments, bridge chip 77 includes one or more active devices such as repeaters (inverters), input/output (I/O) devices, regulators, logic, or programmable gate arrays but are not limited to these active devices. In an embodiment, bridge chip 77 includes one or more passive devices and may also include active devices.

Figure 6:
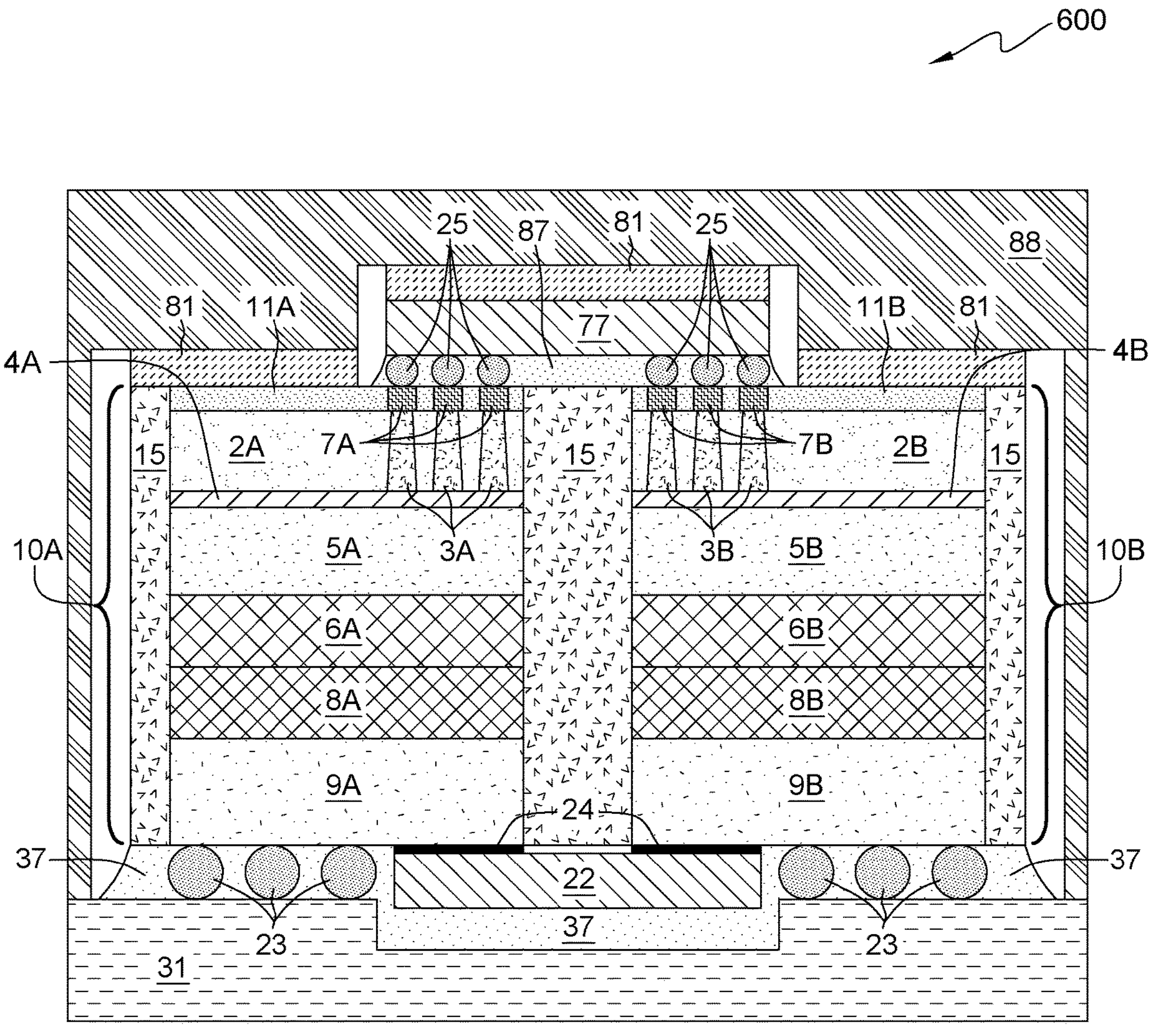
FIG. 6 depicts a cross-sectional view of an example of the final assembly of the semiconductor structure after applying a thermal interface material and a lid, in accordance with an embodiment of the present invention.

FIG. 6 depicts a cross-sectional view of an example of final assembly 600 of the semiconductor structure after applying thermal interface material 81 and heat sink 88, in accordance with an embodiment of the present invention. As depicted, FIG. 6 includes the elements of FIG. 5 with thermal interface material 81 and heat sink 88.

As depicted, final assembly 600 includes chiplet 10A and chiplet 10B each with two stacked semiconductor devices (i.e., top device 6A and bottom device 8A of chiplet 10A and top device 6B and bottom device 8B) attached to substrate 2A and substrate 2B, respectively by TSVs 3A and TSVs 3B. As depicted, dielectric fill 15 surrounds the sidewalls of chiplet 10A and chiplet 10B. Final assembly 600, in various embodiments, also includes bridge chip 22 under and joined to both chiplet 10A and chiplet 10B, and bridge chip 77 above and attached to both chiplet 10A and chiplet 10B. In one case (depicted in FIG. 2), bridge chip 22 can also attach by bumps 23 to PCB 31. In final assembly 600, underfill 37 surrounds bumps 23, can be under and between chiplet 10A and chiplet 10B and covers the exposed surface of PCB 31 adjacent to bumps 25 and bridge chip 22. Additionally, final assembly 600 includes underfill 87 over bridge chip 77 and exposed top surfaces of dielectric layer 11A and 11B above chiplet 10A and chiplet 10B. In some embodiments, final assembly 600 includes more than two chiplets. In some embodiments, final assembly 600 includes more than two bridge chips. In one embodiment, final assembly 600 includes the more than two chiplets and the more than two bridge chips.

As depicted, final assembly 600 can reduce wiring congestion in each of frontside interconnect wiring 5A, frontside interconnect wiring 5B, backside interconnect wiring 9A, and backside interconnect wiring 9B by using bridge chip 77 and bridge chip 22 by moving some of the signal wiring to connect chiplet 10A to chiplet 10B into bridge chip 77 and bridge chip 22. Additionally, by moving some of the signal wiring to bridge chip 22 shorter distances for signal wiring can occur between the semiconductor devices (e.g., bottom device 8A and bottom device 8B) by routing through hybrid bond 24 through bridge chip 22 between chiplet 10A and chiplet 10B. Signals sent from top device 6A to bottom device 8A, for example, do not need to go through bumps 23 and PCB 31. Bridge chip 22 provides a shorter electrical path between chiplet 10A and chiplet 10B, for example. Bridge chip 77 similarly can provide a shorter electrical path between top device 6A and top device 6B. Providing electrical connections between top device 6A and 6B through bridge chip 77 can be shorter than a signal path through top device 6A, bottom device 8A, backside interconnect wiring 9A, bump 23, PCB 31, and back up backside interconnect wiring 9B, bottom device 8B, to top device 6B. Providing shorter electrical paths between the semiconductor devices in chiplet 10A to the semiconductor devices in chiplet 10B can improve the electrical performance of chiplet 10A and chiplet 10B. As previously discussed, chiplet 10A and chiplet 10B can be a semiconductor chip. Final assembly 600 provides a semiconductor chip designer or a system designer with many options to form various stacked device types in each of chiplet 10A and chiplet 10B. Additionally, any suitable known type of chip interconnection can be used to join bridge chip 22 and bridge chip 77 to chiplet 10A and chiplet 10B or to PCB 31.

Using final assembly 600 with micro-bumps 25 connecting to each frontside interconnect wiring 5A through TSVs 3A to bridge chip 77, backside interconnect wiring 9A, and backside interconnect wiring 9B connecting through hybrid bond 24 to bridge chip 22 along with bumps 23 connecting to PCB 31 can double the connection (e.g., input/output (I/O)) density of the two stacked semiconductor devices (e.g., top device 6A and bottom device 8A in chiplet 10A and top device 6B and bottom device 8B in chiplet 10B) compared to conventional unstacked devices or to stacked semiconductor devices without two bridge chips connecting chiplet 10A and chiplet 10B. Additionally, any type of known heat sink for heat sink 88 and heat sink 88 assembly to PCB 31 may be used in final assembly 600.

Figure 7A:
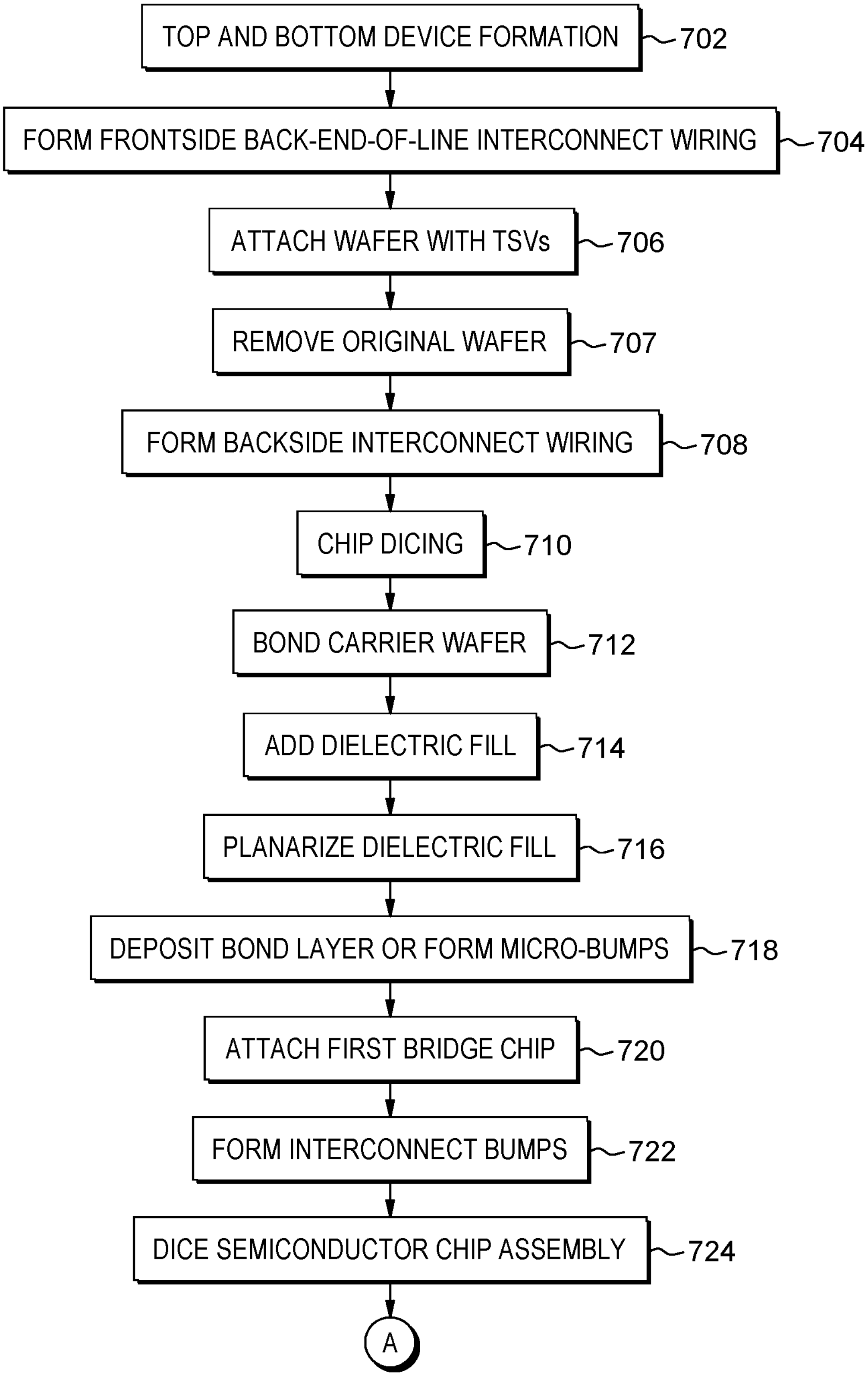
FIG. 7A and FIG. 7B provides one example of the operational steps of a method to form the final assembly depicted in FIG. 6, in accordance with an embodiment of the present invention.
Figure 7B:
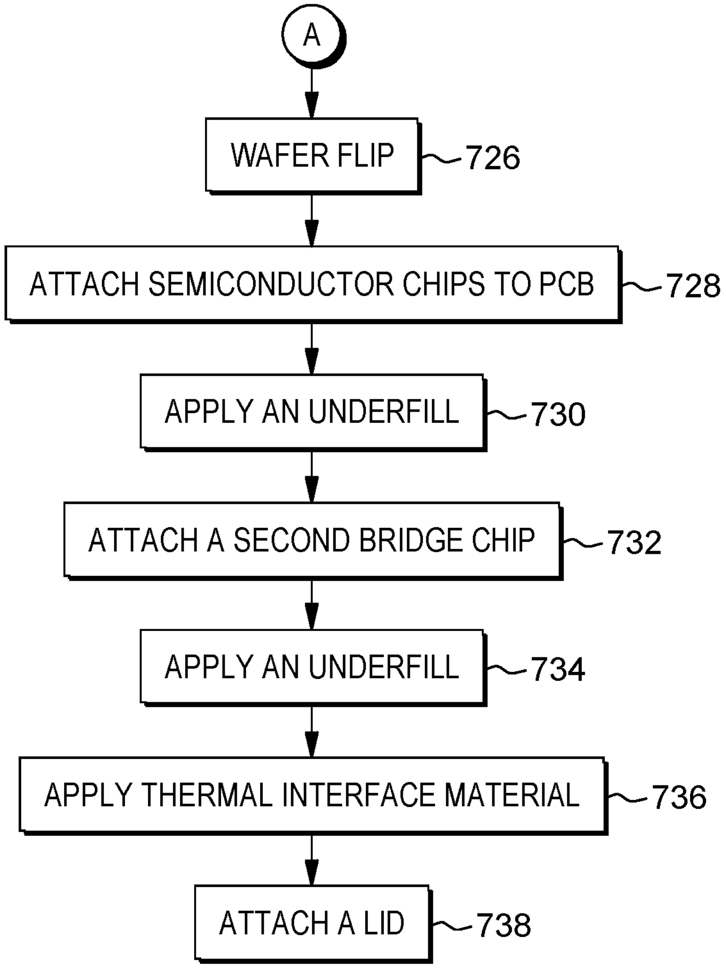

FIG. 7A and FIG. 7B provide one example of the operational steps of a method to form final assembly 600 depicted in FIG. 6 in accordance with an embodiment of the present invention.

Step 702 includes forming a top semiconductor device with frontside interconnect wiring contacting a bottom semiconductor device, using known semiconductor device formation processes discussed in detail with reference to FIG. 1. The top semiconductor device and the bottom semiconductor device in each of the two semiconductor chiplets can be formed with any known semiconductor manufacturing process for forming stacked semiconductor devices. The stacked semiconductor devices may be formed on a single original or first wafer as in the case of the semiconductor processes for creating a complimentary field-effect transistor or CFET (e.g., using stacked nanosheet layers) or on two single first wafers that are joined or bonded together.

For example, in one approach to form two stacked semiconductor devices, the top semiconductor device (e.g., top device 6A) and the bottom semiconductor device (e.g., bottom device 8A) may be formed using known nanosheet layer stacks. Two stacked semiconductor devices in a complimentary field-effect transistor (CFET) can be formed using known CFET semiconductor manufacturing processes. For example, a tall semiconductor fin is patterned, and two stacked FET devices are formed on the fin.

In a second approach, two separate devices layers each with frontside interconnect wiring which may be on separate substrates or wafers where one substrate includes TSVs. The two separate devices are bonded together using any of a variety of known bonding processes (e.g., hybrid bonding, other known chip-to-chip, chip-to-wafer, or wafer-to-wafer bonding process), the substrate without TSVs is removed and backside interconnect wiring formed on the exposed bottom semiconductor device.

In some cases, the BEOL processes for forming the frontside interconnect wiring occur before bonding of the device layers, and in other cases, the BEOL processes for frontside interconnect wiring occur after bonding the device layers. In a third approach, also known as a monolithic approach, a first device layer is formed, a transfer process attaches a semiconductor layer on the first device layer, and a second device layer is formed on the transferred semiconductor layer.

Similarly, using one of these known approaches or any other known method to form at least two stacked semiconductor devices, a second set of stacked semiconductor devices can be formed (e.g., top device 6B stacked with bottom device 8B and top device 6A stacked with bottom device 8A as depicted in FIG. 1).

In some cases, after forming two sets of the two stacked semiconductor devices composed of a top semiconductor device and a bottom semiconductor device, step 704 includes forming the frontside interconnect wiring on each top semiconductor device of the stacked semiconductor devices using known BEOL semiconductor processes. As part of the BEOL semiconductor processes forming the frontside interconnect wiring, a dielectric layer with copper pads for hybrid bonding can be deposited using various known deposition and patterning processes. In other embodiments, the frontside interconnect wiring is formed on the top semiconductor device before forming the bottom device electrically and physically connected to the top semiconductor device.

Step 706 includes attaching a wafer with TSVs to the frontside interconnect wiring of each of the two semiconductor chiplets with the two stacked semiconductor devices. The wafer with TSVs can be attached, for example, by hybrid bonding, after aligning the capture pads of the TSVs with interconnect pads on the surface of the frontside interconnect wiring. The dielectric surfaces and the interconnect pads on the surface of each of the wafers (e.g., the wafer with substrate 2A and TSVs and the wafer with substrate 2B with TSVs) can be aligned with the oxide and metal pads of the bond layer on each of the two frontside interconnect wiring (e.g., each of frontside interconnect wiring 5A and frontside interconnect wiring 5B). In various embodiments, each wafer with TSVs is flipped after the hybrid bonding.

The wafer with TSVs attached to the frontside interconnect wiring of each of the stacked semiconductor devices can be permanently attached (i.e., the wafer with TSVs is a permanent wafer attached to the frontside as opposed to a carrier wafer that is removed later). As previously discussed, in some embodiments, the wafer has vias extending into the wafer that have not yet formed the TSVs. In this embodiment, after bonding the wafer with vias that is encapsulated in a dielectric material (e.g., dielectric fill 15 of FIG. 1 or mold material 141 of FIG. 9), a wafer grind process removes a top portion of the wafer to expose the vias and form TSVs. In some cases, the top portion of the wafer with vias is removed prior to depositing the dielectric fill around the two chiplets.

Step 707 includes removing the first wafer. Using one or more known wafer grinding and/or semiconductor etching processes, the first wafer is removed.

Step 708 includes forming the backside interconnect wiring on each of the two top devices in the two stacked semiconductor devices. Using known BEOL semiconductor processes, forming the backside interconnect wiring on the top device each of the two stacked semiconductor devices occurs using conventional semiconductor processes. In some embodiments, the two stacked semiconductor devices with frontside interconnect wiring, bonded to the wafer with TSVs, and with backside interconnect wiring are each a chiplet or a semiconductor chip.

Step 710 includes chip dicing to form two semiconductor chiplets or two semiconductor chips. In other embodiments, the chip dicing may form more than two semiconductor chiplets. Each of the two semiconductor chips or chiplets are diced to include at least (1) the two stacked semiconductor devices, (2) the frontside interconnect wiring (3) the substrate with TSVs, and (4) backside interconnect wiring in each of the two semiconductor chiplets. Using conventional chip dicing processes, each wafer or substrate with TSVs attaches to the frontside interconnect wiring on a top semiconductor device that is stacked over a bottom semiconductor device is diced. Two semiconductor chips such as chiplet 10A and chiplet 10B in FIG. 1 can be formed where in FIG. 1, chiplet 10A includes, for example, top device 6A, frontside interconnect wiring 5A, substrate 2A with TSVs 3A, bottom device 8A, and backside interconnect wiring 9A. As previously discussed, the two diced chiplets (e.g., chiplet 10A and chiplet 10B) may also be semiconductor chips in some embodiments. In other examples, more than two diced chiplets may be formed on more than two wafers with TSVs and diced.

Step 712 includes bonding a carrier wafer to both of the semiconductor chiplets. For example, as depicted in FIG. 1, carrier wafer 20 is bonded by bonding layer 21 to chiplet 10A and to chiplet 10B. The bonding layer can be a bonding film. The material for the bonding film in the bonding layer can be a removable bonding film. The bonding layer composed of the removable bonding film can release the carrier wafer from the two semiconductor chips in a later process step.

Step 714 includes adding a dielectric fill. The dielectric fill, such as dielectric fill 15 depicted in FIG. 1, is deposited using known deposition methods such as but not limited to spin-coating, chemical or physical vapor deposition, atomic layer deposition. The dielectric fill deposits around and over exposed surfaces of the two semiconductor chips, around the two wafers with TSVs, and over the carrier wafer (e.g., over the bonding film on the carrier wafer). The dielectric fill can be composed of one or more layers of organic (e.g., polymers) or inorganic material (e.g., $SiO_2$) but is not limited to these materials.

Step 716 includes planarizing the dielectric fill to expose the backside interconnect wiring. After planarizing the dielectric fill, interconnect pads may be formed on the exposed surface of the backside interconnect wiring. A portion of the interconnect pads that will correspond in later processes with the first bridge chip may include the formation of a bond layer for hybrid bonding to the first bridge chip. A second portion of the interconnect pads on the outer opposing sides of the two semiconductor chips attached to the carrier wafer can be metalized for later interconnect bump formation (e.g., C4s).

Step 718 includes depositing a bond layer for hybrid bonding or forming micro-bumps on adjacent center portions or first adjacent portions of interconnect pads on each of the two backside interconnect wiring surfaces. Either a bond layer or micro-bumps such as micro-C4s or micro-solder bumps can be formed on the first portion of the backside interconnect wiring adjacent to the dielectric fill between the two semiconductor chips. For example, FIG. 2 depicts hybrid bond 24 and an alternative micro-bump 25 bonding in optional breakout A. The bond layer for hybrid bond 24 can be deposited on one or both surfaces of the backside interconnect wiring 9A and 9B and bridge chip 22. Similarly, micro-bumps (e.g., micro-bumps 25) can be deposited on one of the outer edges or outer portion of the first bridge chip (e.g., bridge chip 22) or the backside interconnect wiring of each of the chiplets (e.g., backside interconnect wiring 9A and 9B).

In addition to depositing the bond layer for hybrid bonding or alternatively, forming micro-bumps, the interconnection bumps or C4s are deposited using known semiconductor bumping or C4 processes. The C4s or interconnection bumps reside on a second outer portion of backside interconnect wiring on the far side of each of the two semiconductor chiplets (e.g., away from the dielectric fill between the two semiconductor chiplets). As depicted in FIG. 2, the C4s or bumps 23 can be formed on backside interconnect wiring 9A and 9B, outside of the location of the bonding layer for hybrid bond 24 or the alternative, micro-bumps 25 depicted in optional breakout A of FIG. 2. The micro-bumps, when formed, can be approximately one-half the size and height of the C4s as the interconnect bumps on the second portion of the backside BEOL interconnect wiring. In other cases, the interconnect bumps can be formed in step 722.

Step 720 includes attaching a first bridge chip to the first portion of the backside interconnect wiring by one of a hybrid bond, a batch reflow of the micro-bumps, or by thermal compression bonding. Using known chip interconnection processes such as either hybrid bonding, thermal compression bonding, or solder reflow, two outer portions of the first bridge chip attach to two adjacent or first portions of the backside BEOL interconnect wiring of each of the two semiconductor chiplets. In some embodiment, after attaching the first bridge chip using the micro-bumps, an underfill material is deposited under the first bridge chip and around the micro-bumps.

Step 722 includes forming interconnect bumps such as C4s on the outer or second portions of the backside interconnect wiring of each of the two semiconductor chiplets. The interconnect bumps can be formed with known interconnect formation processes such as a C4 deposition/reflow process or a solder ball deposition/reflow process. As previously discussed, in some examples, interconnect bump formation can occur prior to attaching the first bridge chip.

Step 724 includes dicing the semiconductor chip assembly. The semiconductor chip assembly is composed of the first bridge chip, the two semiconductor chiplets, a wafer with TSVs, and the carrier wafer is diced. After dicing through the dielectric fill outside of the two semiconductor chiplets and the carrier wafer, the semiconductor assembly includes a portion of the diced carrier wafer under the remaining dielectric fill, the two semiconductor chiplets with interconnect bumps (e.g., C4s), and the first bridge chip.

Step 726 includes carrier wafer flip and then removing the carrier wafer. After flipping the carrier wafer, the bonding film is released to remove the carrier wafer and expose the TSV capture pads on the TSVs of each of the wafers on the two semiconductor chiplets.

Step 728 includes attaching the two semiconductor chiplets to the printed circuit board or a laminate chip carrier. As previously discussed, the two semiconductor chiplets may also be semiconductor chips in some embodiments. One or more reflow processes may join the interconnect bumps and/or a deposited solder paste on the printed circuit board can attach each of the two semiconductor chiplets to the printed circuit board. In other examples, the two semiconductor chiplets may be joined to the printed circuit board or another type of packaging substrate by a conductive adhesive, a connector such as a land grid array connector, or other known method of forming an electrical and mechanical connection between the two chiplets and the printed circuit board. As previously discussed, the interconnect bumps are on a second portion of the backside interconnect wiring adjacent to the facing sidewall of the two semiconductor chiplets. In other words, the interconnect bumps on each of the two semiconductor chiplets or alternatively, on the printed circuit board, and are on a side portion of the two semiconductor chiplets that is outside of two sides of the first bridge chip. After attaching the two semiconductor chiplets to the printed circuit board, the first bridge can reside in a cavity in the printed circuit board.

Step 730 includes applying an underfill material beneath the dielectric fill, beneath each of the exposed surfaces of the two semiconductor chiplets, and over, around, and under the first bridge chip. The underfill material can be any known underfill material used in semiconductor chip or semiconductor packaging applications that is applied with known processes.

Step 732 includes attaching a second bridge chip to TSV capture pads using one of a micro-bump or hybrid bonding. After removing the carrier wafer, either micro-bumps or TSV capture pads can be formed using known processes. The micro-bumps can be formed on either the second bridge chip or the TSV capture pads.

Step 734 includes applying an underfill material beneath the second bridge chip. When the second bridge chip is attached to the TSV capture pads by micro-bumps, the underfill material may be deposited under the second bridge chip. After deposition, in this example, the underfill material is between the second bridge chip and the first portions of the frontside interconnect wiring on both semiconductor chiplets, and between the second bridge chip and the dielectric fill between the two semiconductor chiplets.

Step 736 includes applying a thermal interface material on the second bridge chip, on exposed surfaces of the dielectric layer on the two wafers with TSVs using known deposition methods and any known thermal interface material. After applying the thermal interface material, using known methods, in step 738, a lid is attached over the thermal interface material and over at least the two semiconductor chiplets. In some cases, the lid is around the two semiconductor chiplets and attaches by known methods (e.g., clips, screws, or adhesives) to the printed circuit board which may also be another laminate, ceramic, flexible film carrier, or another type of semiconductor packaging substrate.

Figure 8:
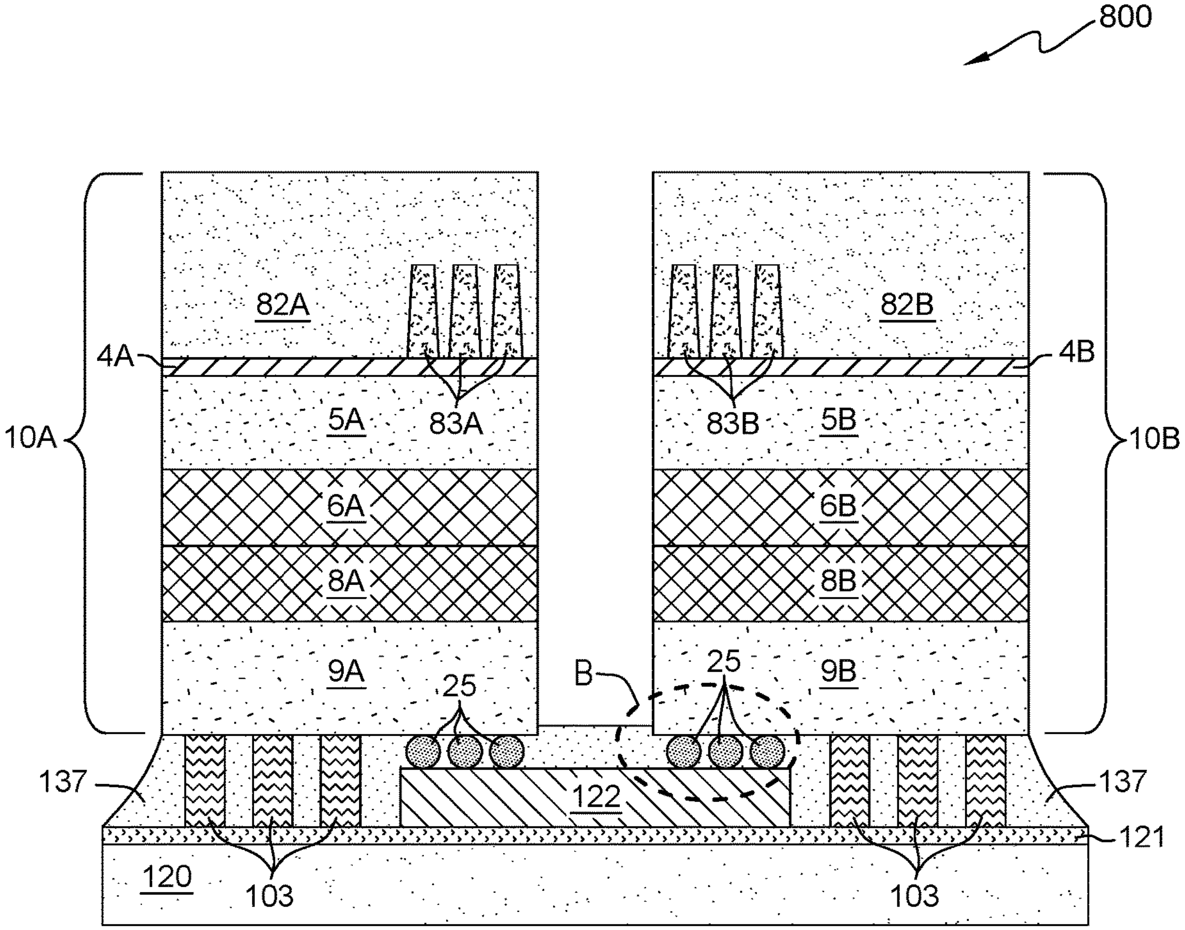
FIG. 8 depicts a cross-sectional view of another first sub-assembly of a semiconductor structure with two semiconductor chips that are each attached to a wafer with through-silicon vias and to both a first bridge chip and a carrier wafer, in accordance with an embodiment of the present invention.
Figure 8:
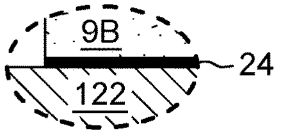
Figure 9:
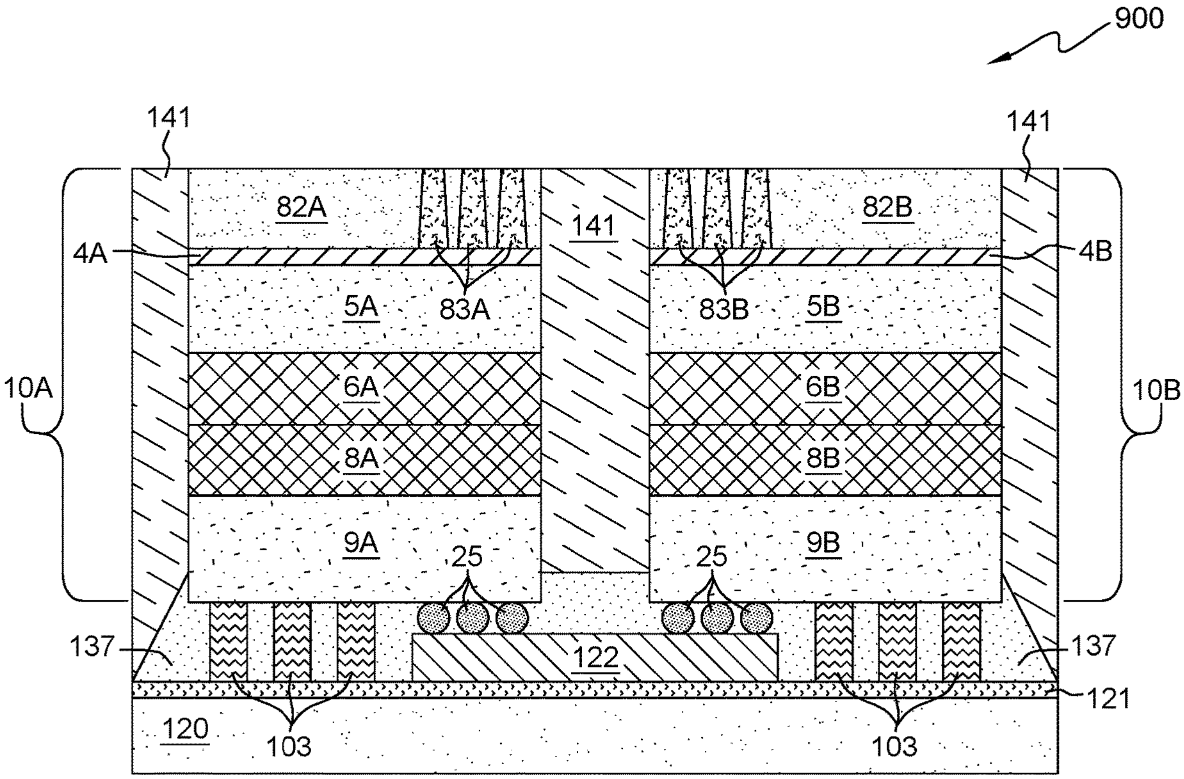
FIG. 9 is a cross-sectional view of a sub-assembly of the semiconductor structure after depositing a mold material around and between the two semiconductor chips and over the underfill material, and after thinning the two wafers with through-silicon vias, in accordance with an embodiment of the present invention.

FIG. 8 depicts a cross-sectional view of another first sub-assembly 800 of a semiconductor structure with chiplet 10A and 10B each attached to substrate 82A and 82B and to both bridge chip 122 and carrier wafer 120, in accordance with an embodiment of the present invention. As depicted in FIG. 8, substrate 82A and substrate 82B include vias 83A and 83B that will form TSVs after planarizing substrate 82A and 82B in subsequent processing (i.e., vias 83A and 83B will form TSVs 83A and 83B, respectively, as depicted in FIG. 9). In other embodiments, substrate 82A and substrate 82B include TSVs 83A and 83B, respectively instead of the vias depicted in FIG. 8.

As depicted, FIG. 8 includes chiplet 10A and chiplet 10B. In FIG. 8, chiplet 10A includes frontside interconnect wiring 5A, top device 6A, bottom device 8A with backside interconnect wiring 9A, and substrate 82A with vias 83A where substrate 82A bonds by hybrid bond 4A to frontside interconnect wiring 5A. As depicted, chiplet 10B includes frontside interconnect wiring 5B, top device 6B, bottom device 8B with backside interconnect wiring 9B, hybrid bond 4B, and substrate 82B. Also, as depicted in first sub-assembly 800, chiplet 10A and chiplet 10B are each connected to bridge chip 122 by micro-bumps 25 and bond film 121 by copper pillars 103. Bond film 121 connects to a surface of carrier wafer 120, and underfill material 137 surrounds copper pillars 103, micro-bumps 25, and is between exposed surfaces of bond film 121 and chiplets 10A and 10B. As previously discussed, chiplet 10A and chiplet 10B of FIG. 8 can each be a semiconductor chip.

Also, illustrated in FIG. 8 is an optional breakout B depicting hybrid bond 24 formed instead of micro-bumps 25. As previously discussed, bridge chip 122 like bridge chip 22 may be attached to chiplet 10A and chiplet 10B by either micro-bumps 25 or hybrid bond 24 where micro-bumps 25 and hybrid bond 24 maybe formed on one of bridge chip 122 or chiplet 10A and chiplet 10B. Chiplet 10A, chiplet 10B, hybrid bond 4A, hybrid bond 4B, and micro-bumps 25 are essentially the same as these elements in FIG. 1-3 with the exception of substrate 82A and 82B. Substrate 82A and 82B are depicted with vias while substrate 2A and 2B include TSVs 3A and 3B. As depicted, vias labeled 83A and 83B extend partially through substrate 82A and substrate 82B, after wafer thinning in later processes as depicted in FIG. 9, the vias will become TSVs 83A and 83B, respectively.

Using one of the previously discussed known device formation processes, forming top device 6A stacked with bottom device 8A and forming top device 6B stacked with bottom device 8B, substrate 82A and substrate 82B, respectively, can be joined by hybrid bond 4A and 4B, respectively, to frontside interconnect wiring 9A and frontside interconnect wiring 9B. In one example, copper pillars 103 and micro-bump 25 formation or alternatively, a bond layer deposition for hybrid bond 24 instead of micro-bump 24 formation, may occur one of before substrate 82A and substrate 82B attach to chiplet 10A and chiplet 10B or may occur before chip dicing of chiplet 10A and chiplet 10B. Copper pillar 103 and micro-bump 25 formation or the deposition of an oxide/metal layer for hybrid bonding can occur on either two portions of backside interconnect wiring 9A and backside interconnect wiring 9B or on bridge chip 122. Similarly, the formation of copper pillars 103 can occur on either bridge chip 122 or backside interconnect wiring 9A and backside interconnect wiring 9B using known processes.

Using known copper pillar formation processes, copper pillars 103 attach to exposed interconnect pads on a second portion of backside interconnect wiring 9A and a second portion of backside interconnect wiring 9B. After applying bond film 121 to attach carrier wafer 120, copper pillars 103 also are attached to bond film 121 on carrier wafer 120.

Bridge chip 122 bonds to carrier wafer 120 using known chip-to-wafer bonding processes. In some embodiments, bridge chip 122 is joined to carrier wafer 120 before joining to chiplet 10A and chiplet 10B, bridge chip 122 can be bonded to carrier wafer 120 using one or more of hybrid oxide to oxide bonding, an oxide-to-oxide bond, and an adhesive bond but is not limited to these types of bonding. Bridge chip 122 is the same or similar to bridge chip 22 (e.g., similar shape and functionality options as previously discussed with reference to bridge chip 22).

After joining chiplet 10A and chiplet 10B to carrier wafer 120, underfill material 137 deposition occurs under and around the bottom surfaces of backside interconnect wiring 9A and backside interconnect wiring 9B covering bridge chip 122 and portions of bond film 121 on carrier wafer 120 around and adjacent to micro-bumps 25 and copper pillars 103.

FIG. 9 depicts a cross-sectional view of sub-assembly 900 of the semiconductor structure after thinning substrate 82A and substrate 82B to form TSVs 83A and TSVs 83B and depositing mold material 141 around exposed surfaces of chiplet 10A, chiplet 10B, and underfill material 137, in accordance with an embodiment of the present invention. As depicted, FIG. 9 includes the elements of FIG. 8 with mold material 141 added and a top portion of mold material 141, substrate 82A and substrate 82B removed. Using known compression molding processes, mold material 141 surrounds the sidewalls of substrate 82A, substrate 82B, chiplet 10A, chiplet 10B, and over exposed portions of substrate 82A, substrate 82B, and underfill material 137. The top portion of mold material 141 over substrate 82A and substrate 82B can be removed and substrate 82A and substrate 82B thinned, for example by grinding, to expose top portions of vias 83A and vias 83B forming the through-silicon vias (e.g., TSVs 83A and TSVs 83B). After thinning substrate 82A and substrate 82B, vias 83A and vias 83B hereinafter will be called TSVs 83A and TSVs 83B.

Figure 10:
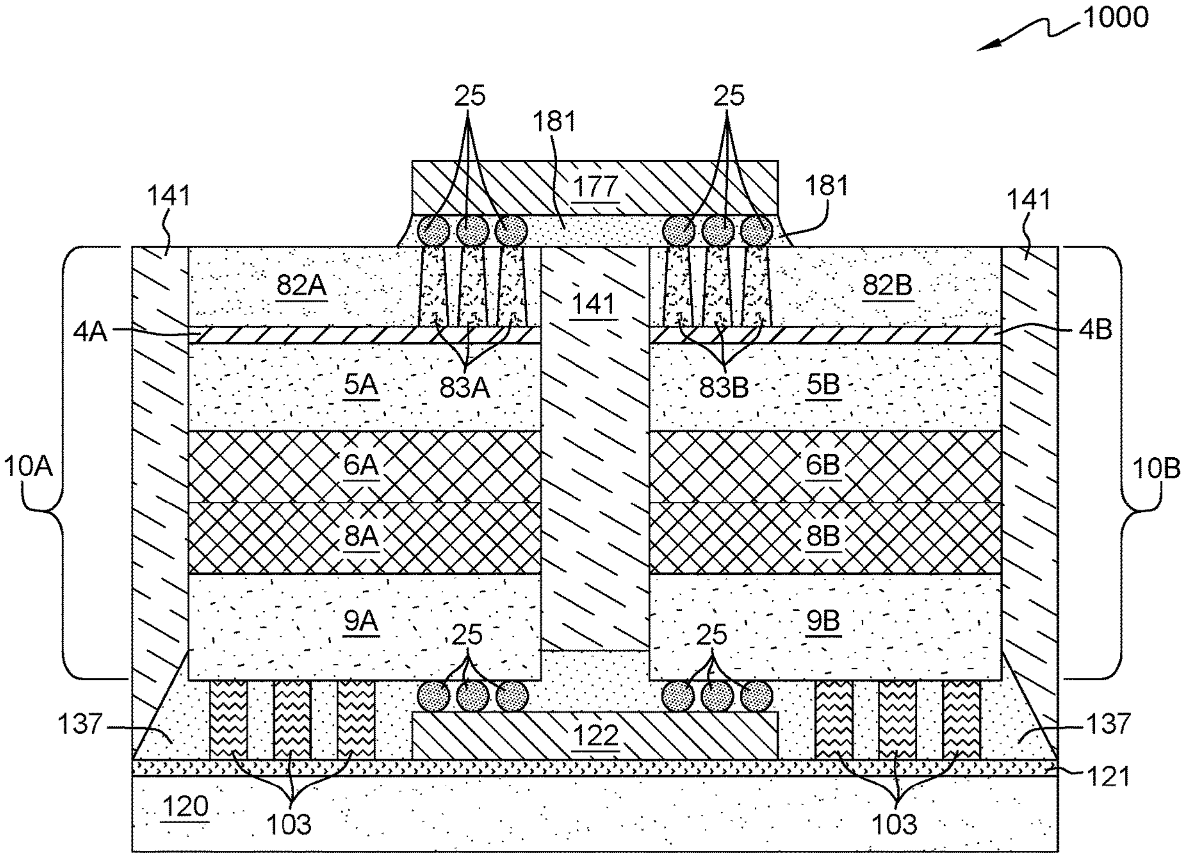
FIG. 10 depicts a cross-sectional view of a sub-assembly of the semiconductor structure after forming micro-bumps, attaching a second bridge chip, and depositing underfill material, in accordance with an embodiment of the present invention.

FIG. 10 depicts a cross-sectional view of sub-assembly 1000 of the semiconductor structure after forming micro-bumps 25, attaching bridge chip 177, and depositing underfill 181, in accordance with an embodiment of the present invention. As depicted, FIG. 10 includes the elements of FIG. 9 with underfill 181 and bridge chip 177 attaching to TSVs 83A and TSVs 83B by micro-bumps 25. Bridge chip 177 attaches to substrate 82A and 82B using any of the processes previously discussed with respect to joining bridge chip 77 to frontside interconnect wiring 5A and 5B. TSVs 83A and TSVs 83B may be topped or covered by capture pads in a dielectric layer (not depicted in FIG. 10).

Figure 11:
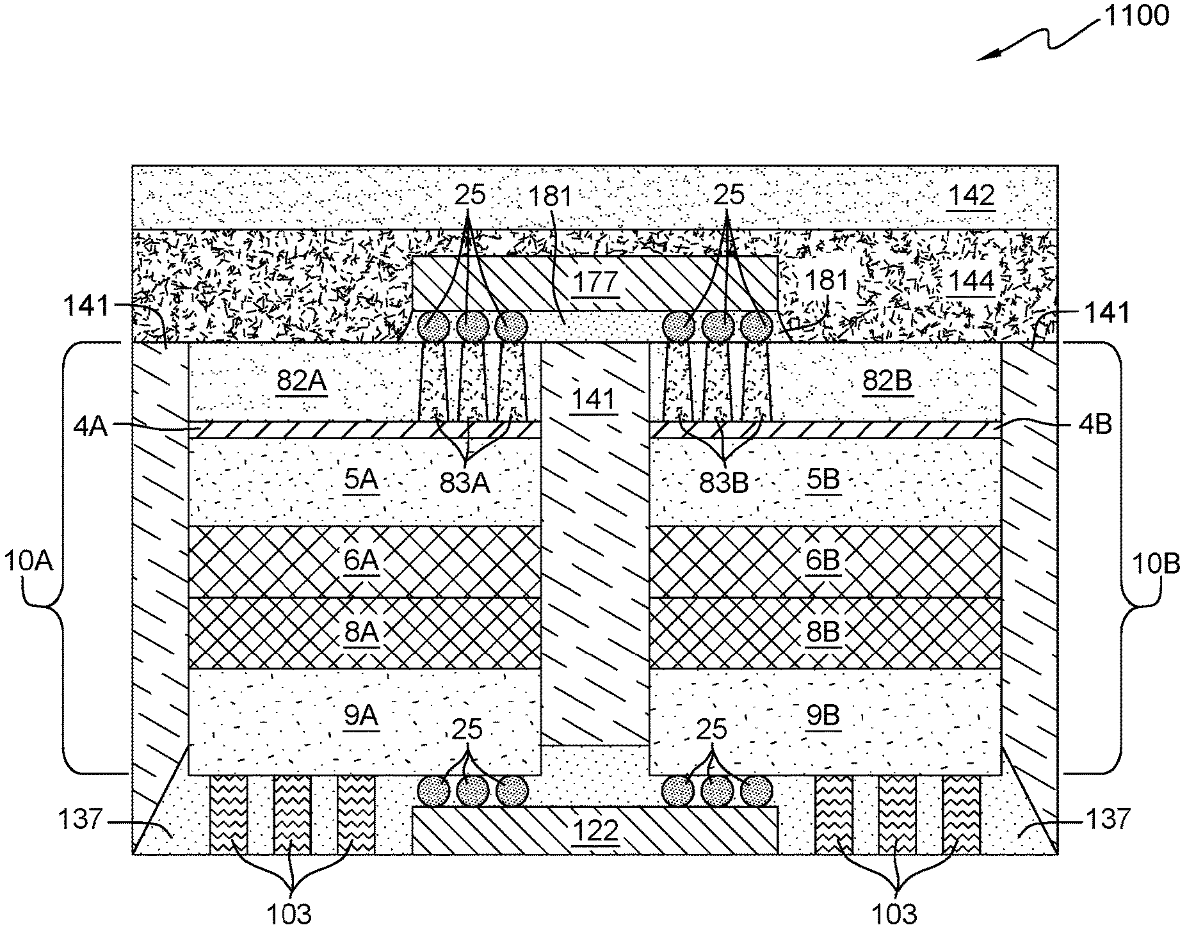
FIG. 11 depicts a cross-sectional view of the sub-assembly of the semiconductor structure after attaching a carrier wafer by a planarizing bond film and removing the carrier wafer, in accordance with an embodiment of the present invention.

FIG. 11 depicts a cross-sectional view of sub-assembly 1100 of the semiconductor structure after attaching carrier wafer 142 by bond film 144 and removing carrier wafer 120 by releasing bond film 121, in accordance with an embodiment of the present invention. As depicted, FIG. 11 includes the elements of FIG. 10 with bond film 144 and carrier wafer 142 but without carrier wafer 120 and bond film 121.

As depicted in FIG. 11, a thick, temporary planarizing bonding film is applied for as bond film 144 that attaches carrier wafer 142 to bridge chip 177, substrate 82A of chiplet 10A, substrate 82B of chiplet 10B, and mold material 141. Carrier wafer 120 can be de-attached or removed by removing bond film 121. Bond film 121 can be separated from the bottom surface of copper pillars 103, bridge chip 122, and underfill material 137. In FIG. 11, after releasing carrier wafer 120, the bottom surfaces of copper pillars 103 and the bottom surface of bridge chip 122 can be exposed. In an embodiment, carrier wafer 142 is flipped.

Figure 12:
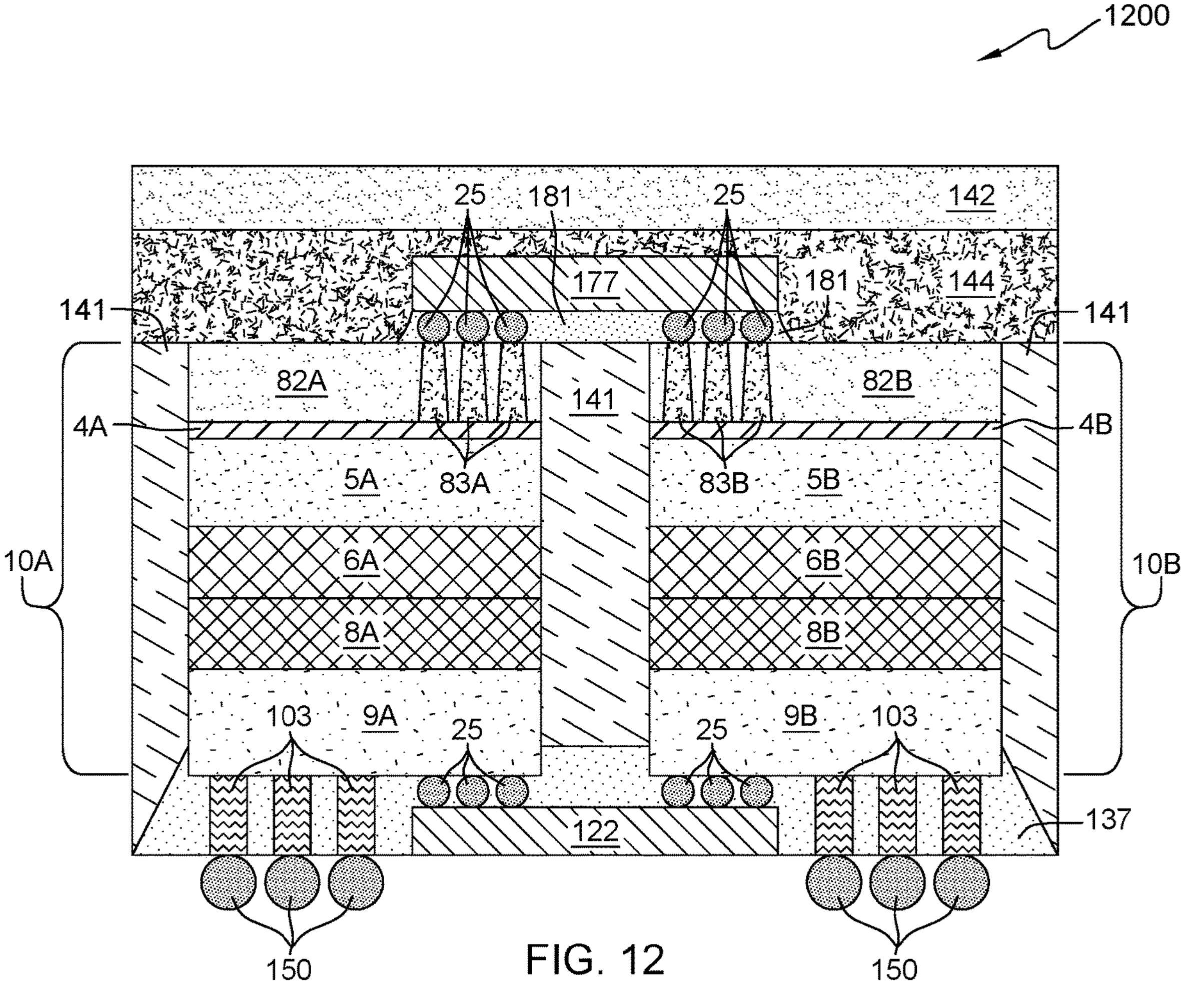
FIG. 12 depicts a cross-sectional view of the sub-assembly of the semiconductor structure after forming interconnects on the exposed surface of the copper pillars, in accordance with an embodiment of the present invention.

FIG. 12 depicts a cross-sectional view of sub-assembly 1200 of the semiconductor structure after forming interconnects 150 on the exposed surface of copper pillars 103, in accordance with an embodiment of the present invention. As depicted, FIG. 12 includes the elements of FIG. 11 with interconnects 150.

Interconnects 150 can be solder balls, C4s, another copper pillar, or any other known type of chip or chip package that can include multiple chips to package interconnect. In some embodiments, interconnects 150 are C4s or solder bumps formed, using previously discussed methods, on each of copper pillars 103.

Figure 13:
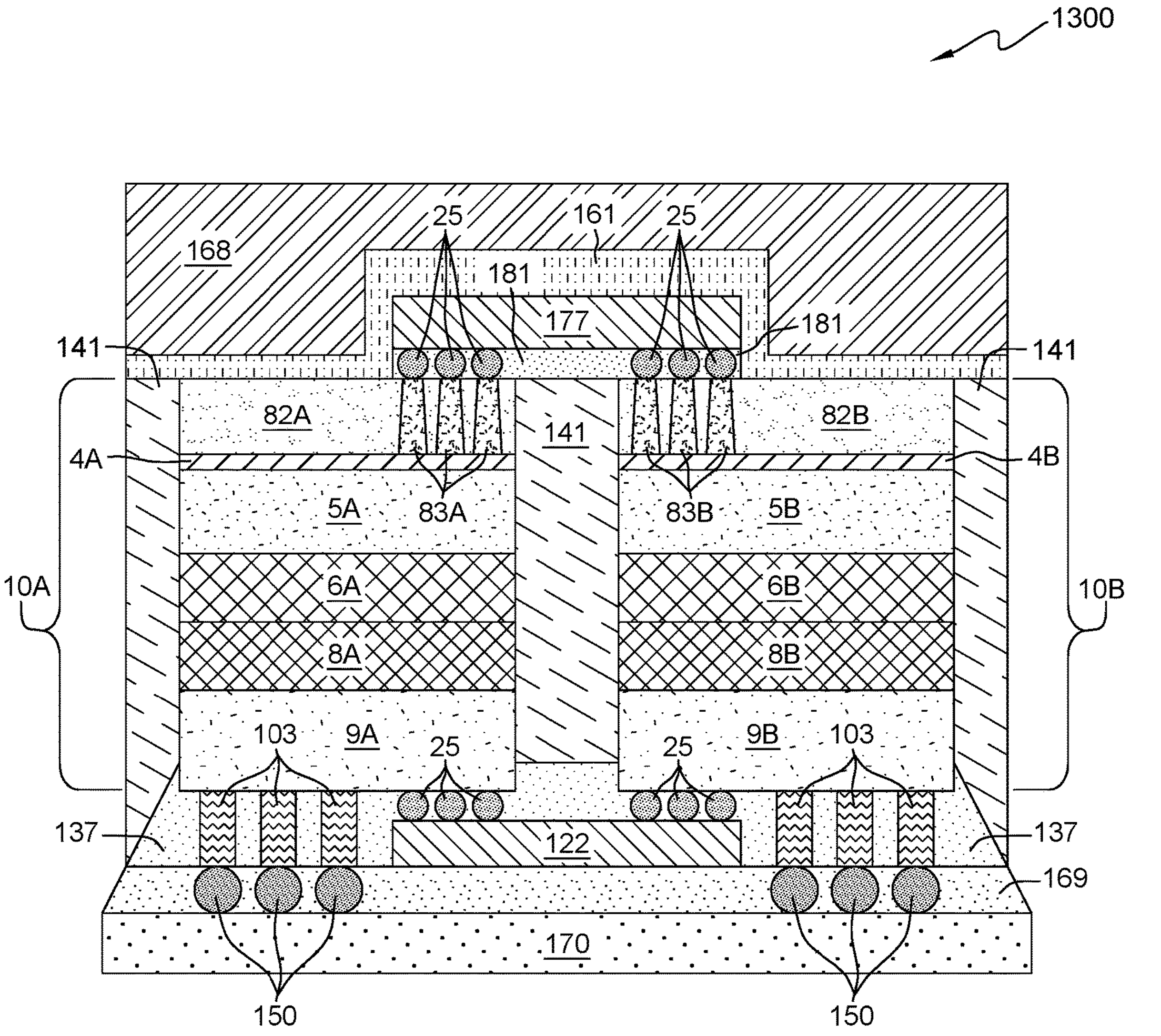
FIG. 13 depicts a cross-sectional view of a final assembly of the semiconductor structure after removing the carrier wafer and the bond film, joining interconnects to the package substrate, depositing an underfill material, depositing a thermal interface material on a second bridge chip, and over the top surface of the two wafers with vias for TSVs, and then attaching a lid, in accordance with an embodiment of the present invention.

FIG. 13 depicts a cross-sectional view of final assembly 1300 of the semiconductor structure after removing carrier wafer 142 and bond film 144, joining interconnects 150 to package substrate 170, depositing underfill 169, depositing thermal interface material 161 on bridge chip 177 and over the top surface of substrate 82A and substrate 82B, and then attaching heat sink 168 to thermal interface material 161, in accordance with an embodiment of the present invention. As depicted, FIG. 13 includes the elements of FIG. 12 without carrier wafer 142 and bond film 144 and with the addition of interconnects 150, underfill 169, chip carrier packaging substrate 170, thermal interface material 161, and heat sink 168. Package substrate 170 can be any type of package substrate for a multichip assembly or a multi-chiplet assembled package with multiple chiplets. Package substrate 170 may be an organic package substrate such as a PCB or flexible film. In another example, package substrate 170 can be an inorganic substrate such as a ceramic substrate or a semiconductor-based substrate such as another wafer or a portion of a wafer. In various embodiments, thermal interface material 161 is between heat sink 168, which can be a lid, and the chiplet assembly with bridge chip 177. If heat sink 168 is a lid, then the lid it will enclose the chip package with bridge chip 177 and bridge chip 122 and be adhered to the laminate by adhesive, a screw, or may have a pressure fit, for example. The thermal interface material 161 can be, for example, a thermal grease or a liquid metal. If there is no lid, then heat sink 168 will be in close proximity to the top of bridge chip 177, substrate 82A and substrate 82B. In these cases, heat sink 168 will most likely be bolted down to packaging substrate 170. Heat sink 168 may be connected to mold material 141 and/or to packaging substrate 170 by known methods such as an adhesive to mold material 141 and/or to mold material 141, fasteners to package substrate 170, or another known heat sink attachment method.

As depicted in FIG. 13, a first or upper set of micro-bumps 25 connects bridge chip 177 to each of frontside interconnect wiring 5A and frontside interconnect wiring 5B by TSVs 83A and 83B, respectively, and a second set of micro-bumps 25 to bridge chip 122 to backside interconnect wiring 9A and backside interconnect wiring 9B, respectively. As depicted, copper pillars 103 connect by interconnects 150 to package substrate 170. Final assembly 1300 can double the chip connection or I/O density of the two stacked semiconductor devices (e.g., top device 6A and bottom device 8A in chiplet 10A and top device 6B and bottom device 8B in chiplet 10B) compared to conventional unstacked devices or to stacked semiconductor devices without two bridge chips connecting chiplet 10A and chiplet 10B.

Final assembly 1300 provides two bridge chips connecting two semiconductor chips or two chiplets with stacked semiconductor devices (e.g., bridge chip 122 and bridge chip 177 connecting chiplet 10A and chiplet 10B). Final assembly 1300 can reduce wiring congestion in frontside and backside interconnect wiring, provide faster signal connections and shorter signal paths between frontside interconnect wiring 5A and 5B and top device 6A and top device 6B along with providing the ability for shorter signal paths and faster signal connections between bottom device 8A and 8B.

Furthermore, as previously discussed in detail with respect to sub-assembly 100, final assembly 1300 also provides a semiconductor or system designer with a large number of options for using different stacked devices in each of the semiconductor chiplets 10A and 10B where chiplet 10A and chiplet 10B can each be semiconductor chip. Final assembly 1300 can provide a number of stacked device options, a number of different chip-to-chip interconnect options, and a number of chip to packaging substrate options for joining chiplet 10A and chiplet 10B to package substrate 170. Additionally, any type of known heat sink and heat sink 168 assembly can be used with final assembly 1300.

In some embodiments, final assembly 1300 includes more than two chiplets. In some embodiments, final assembly 1300 includes more than two bridge chips. In other embodiments, chiplet 10A and chiplet 10B include more than two stacked semiconductor devices. In one embodiment, final assembly 1300 includes the more than two chiplets and the more than two bridge chips.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
at least two chiplets, wherein each chiplet includes:
a top semiconductor device with frontside interconnect wiring contacting a substrate with a plurality of through-silicon vias; and
a bottom semiconductor device with backside interconnect wiring, wherein the top semiconductor device contacts the bottom semiconductor device;
a first bridge chip connecting to a first portion of the backside interconnect wiring in each chiplet of the at least two chiplets; and
a second bridge chip connecting the frontside interconnect wiring in each chiplet of the at least two chiplets.

2. The semiconductor structure of claim 1, wherein the top semiconductor device and the bottom semiconductor device in each chiplet of the at least two chiplets are electrically connected.

3. The semiconductor structure of claim 1, wherein the top semiconductor device and the bottom semiconductor device are each a different type of semiconductor device in each chiplet of the at least two chiplets.

4. The semiconductor structure of claim 3, wherein the top semiconductor device is a memory device in each chiplet of the at least two chiplets and the bottom semiconductor device is a logic device in each chiplet of the at least two chiplets.

5. The semiconductor structure of claim 1, wherein the top semiconductor device and the bottom semiconductor device are each a same type of semiconductor device in each chiplet of the at least two chiplets.

6. The semiconductor structure of claim 1, wherein the top semiconductor device in a first chiplet of the at least two chiplets is different from the top semiconductor device in a second chiplet of the at least two chiplets, and wherein the bottom semiconductor device in each chiplet of the at least two chiplets is a same type of semiconductor device.

7. The semiconductor structure of claim 1, wherein the first bridge chip connects to the backside interconnect wiring of each chiplet of the at least two chiplets by a chip interconnection selected from the group consisting of a hybrid bond and a plurality of micro-bumps.

8. The semiconductor structure of claim 1, wherein the first bridge chip connects to the backside interconnect wiring of each chiplet of the at least two chiplets by a solder interconnection.

9. The semiconductor structure of claim 1, further comprising:

a dielectric fill surrounding sidewalls of each chiplet of the at least two chiplets;

a hybrid bond connecting a first portion of the backside interconnect wiring of each chiplet of the at least two chiplets to the first bridge chip;

a packaging substrate connected by a plurality of solder bumps to a second portion of the backside interconnect wiring of each chiplet of the at least two chiplets;

a first underfill material surrounding the plurality of solder bumps, wherein the first underfill material is between a bottom surface of the at least two chiplets, the first bridge chip, and the packaging substrate;

a plurality of micro-bumps contacting the second bridge chip;

a second underfill material surrounding the plurality of micro-bumps and contacting the second bridge chip; and a thermal interface material contacting the second bridge chip, exposed portions of the substrate of each chiplet of the at least two at least chiplets, and a heat sink.

10. The semiconductor structure of claim 1, further comprising:

a dielectric fill surrounding sidewalls of each chiplet of the at least two chiplets;

a plurality of micro-bumps connecting a first portion of the backside interconnect wiring of each chiplet of the at least two chiplets to the first bridge chip;

a plurality of pillars connecting a second portion of the backside interconnect wiring to a plurality of package interconnections, wherein the plurality of package interconnections connect to a packaging substrate;

a first underfill being between a bottom portion of the at least two chiplets, under the at least two chiplets, surrounding the first bridge chip, surrounding the plurality of pillars, surrounding the plurality of micro-bumps, and over a second underfill material;

the second underfill material being under the first bridge chip and the first underfill, wherein the second underfill material surrounds the plurality of package interconnections; and a third underfill material connecting the second bridge chip to the substrate with the plurality of through-silicon vias.

11. The semiconductor structure of claim 9, wherein the substrate with the plurality of through-silicon vias in each chiplet of the at least two chiplets, further comprises the plurality of through-silicon vias are in adjacent outer edges of each substrate with the plurality of through-silicon vias in each chiplet of the at least two chiplets.

12. The semiconductor structure of claim 11, wherein the second bridge chip connects the frontside interconnect wiring in each chiplet of the at least two chiplets.

13. A method of forming a semiconductor structure of a first semiconductor assembly, the method comprising:

forming at least a top semiconductor device contacting a bottom semiconductor device on each wafer of two first wafers, wherein the top semiconductor device includes frontside interconnect wiring;

attaching a second wafer with a plurality of through-silicon vias to each of the frontside interconnect wiring on each of the two first wafers;

removing each of the two first wafers;

forming a backside interconnect wiring on each of the bottom semiconductor device;

dicing the second wafer with the plurality of through-silicon vias to form at least two chiplets, wherein each chiplet includes at least the frontside interconnect wiring contacting the top semiconductor device, the top semiconductor device contacting the bottom semiconductor device with the backside interconnect wiring, and a portion of the second wafer with the plurality of through-silicon vias;

bonding a carrier wafer to the at least two chiplets;

forming a dielectric fill around each of the at least two chiplets on the carrier wafer;

planarizing the dielectric fill to expose a surface of the backside interconnect wiring on each chiplet of the at least two chiplets;

attaching a first bridge chip to a first portion of the backside interconnect wiring on each chiplet of the at least two chiplets;

removing the carrier wafer;

attaching a printed circuit board to a second portion of the backside interconnect wiring of each chiplet of the at least two chiplets; and attaching a second bridge chip to the frontside interconnect wiring of each chiplet of the at least two chiplets.

14. The method of claim 13, wherein planarizing the dielectric fill to expose the surface of the backside interconnect wiring on each chiplet of the at least two chiplets further comprises:

depositing a bond layer for hybrid bonding on the first portion of the backside interconnect wiring, and forming solder bumps on the second portion of the backside interconnect wiring.

15. The method of claim 13, wherein planarizing the dielectric fill to expose the surface of the backside interconnect wiring on each chiplet of the at least two chiplets further comprises:

forming micro-bumps on the first portion of the backside interconnect wiring, and forming solder bumps on the second portion of the backside interconnect wiring.

16. The method of claim 13, wherein bonding the carrier wafer to the at least two chiplets includes using a removable bonding film to bond the carrier wafer to each chiplet of the at least two chiplets.

17. The method of claim 13, wherein attaching the printed circuit board to the second portion of the backside interconnect wiring of each chiplet of the at least two chiplets, further comprises applying a first underfill material on a packaging substrate.

18. The method of claim 13, wherein attaching the second bridge chip to the frontside interconnect wiring of each chiplet of the at least two chiplets, further comprises applying a second underfill material under the second bridge chip, and wherein a thermal interface material contacts the second bridge chip and a heat sink.

19. The method of claim 13, wherein:

the top semiconductor device is selected from the group consisting of: a logic device and a memory device; and the bottom semiconductor device is selected from the group consisting of: the logic device and the memory device.

* * * * *